United States Patent
Ohmaru

(10) Patent No.: US 9,601,215 B2
(45) Date of Patent: Mar. 21, 2017

(54) HOLDING CIRCUIT, DRIVING METHOD OF THE HOLDING CIRCUIT, AND SEMICONDUCTOR DEVICE INCLUDING THE HOLDING CIRCUIT

(71) Applicant: Semiconductor Energy Laboratory Co., Ltd., Atsugi-shi, Kanagawa-ken (JP)

(72) Inventor: Takuro Ohmaru, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 155 days.

(21) Appl. No.: 14/676,923

(22) Filed: Apr. 2, 2015

(65) Prior Publication Data

US 2015/0295570 A1    Oct. 15, 2015

(30) Foreign Application Priority Data

Apr. 11, 2014   (JP) .................. 2014-081831

(51) Int. Cl.
*G11C 19/18*   (2006.01)
*H03K 17/00*   (2006.01)
(Continued)

(52) U.S. Cl.
CPC ........ *G11C 19/184* (2013.01); *H01L 27/1207* (2013.01); *H01L 29/24* (2013.01);
(Continued)

(58) Field of Classification Search
CPC ............ H03K 17/005; H03K 19/0016; H03K 3/356008; H01L 27/1207; H01L 29/24;
(Continued)

(56) References Cited

U.S. PATENT DOCUMENTS 3,775,693 A   11/1973   Proebsting
4,797,576 A   1/1989   Asazawa
(Continued)

FOREIGN PATENT DOCUMENTS

CN   102804603 A   11/2012
EP    1737044 A   12/2006
(Continued)

OTHER PUBLICATIONS

Sanghun Jeon et al.; "180nm Gate Length Amorphous InGaZnO Thin Film Transistor for High Density Image Sensor Applications"; IEDM 10: Technical Digest of International Electron Devices Meeting; Dec. 6, 2010; pp. 504-507.

(Continued)

*Primary Examiner* — Richard Elms
*Assistant Examiner* — Ajay Ojha
(74) *Attorney, Agent, or Firm* — Fish & Richardson P.C.

(57) ABSTRACT

A holding circuit includes first to third input terminals, an output terminal, first to third switches, a capacitor, and a node. The first to third switches control conduction between the node and the first input terminal, conduction between the node and the output terminal, and conduction between the second input terminal and the output terminal, respectively. First and second terminals of the capacitor are electrically connected to the node and the third input terminal, respectively. The first to third switches are each a transistor comprising an oxide semiconductor layer comprising a semiconductor region. Owing to the structure, a potential change of the node in an electrically floating state can be suppressed; thus, the holding circuit can retain its state for a long time. The holding circuit can be used as a memory circuit for backup of a sequential circuit, for example.

26 Claims, 14 Drawing Sheets

(51) Int. Cl.
  *H01L 27/12* (2006.01)
  *H01L 29/24* (2006.01)
  *H03K 19/00* (2006.01)
  H03K 3/356 (2006.01)
  G11C 11/405 (2006.01)
  G11C 11/24 (2006.01)
  G11C 14/00 (2006.01)
  G11C 11/412 (2006.01)

(52) U.S. Cl.
  CPC ........ *H03K 17/005* (2013.01); *H03K 19/0016* (2013.01); *G11C 11/24* (2013.01); *G11C 11/405* (2013.01); *G11C 11/412* (2013.01); *G11C 14/0063* (2013.01); *H03K 3/356008* (2013.01)

(58) Field of Classification Search
  CPC ... G11C 11/405; G11C 14/0063; G11C 11/24; G11C 11/412; G11C 19/184
  See application file for complete search history.

(56) References Cited

U.S. PATENT DOCUMENTS

| | | |
|---|---|---|
| 4,800,303 A | 1/1989 | Graham et al. |
| 5,039,883 A | 8/1991 | On |
| 5,731,856 A | 3/1998 | Kim et al. |
| 5,744,864 A | 4/1998 | Cillessen et al. |
| 5,980,092 A | 11/1999 | Merryman et al. |
| 6,049,883 A | 4/2000 | Tjandrasuwita |
| 6,078,194 A | 6/2000 | Lee |
| 6,204,695 B1 | 3/2001 | Alfke et al. |
| 6,281,710 B1 | 8/2001 | Poirier et al. |
| 6,294,274 B1 | 9/2001 | Kawazoe et al. |
| 6,563,174 B2 | 5/2003 | Kawasaki et al. |
| 6,573,754 B2 | 6/2003 | Menczigar et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,076,748 B2 | 7/2006 | Kapoor et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,576,582 B2 | 8/2009 | Lee et al. |
| 7,674,650 B2 | 3/2010 | Akimoto et al. |
| 7,732,819 B2 | 6/2010 | Akimoto et al. |
| 8,467,231 B2 | 6/2013 | Matsuzaki |
| 8,575,985 B2 | 11/2013 | Ohmaru et al. |
| 8,593,856 B2 | 11/2013 | Koyama et al. |
| 8,705,267 B2 | 4/2014 | Endo et al. |
| 8,773,906 B2 | 7/2014 | Ohmaru |
| 8,891,286 B2 | 11/2014 | Endo et al. |
| 2001/0046027 A1 | 11/2001 | Tai et al. |
| 2002/0036529 A1 | 3/2002 | Furusawa et al. |
| 2002/0056838 A1 | 5/2002 | Ogawa |
| 2002/0074568 A1 | 6/2002 | Yoshida et al. |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0038582 A1 | 2/2006 | Peeters |
| 2006/0043377 A1 | 3/2006 | Hoffman et al. |
| 2006/0091793 A1 | 5/2006 | Baude et al. |
| 2006/0095975 A1 | 5/2006 | Yamada et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0119394 A1 | 6/2006 | Dronavalli |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0024318 A1 | 2/2007 | Mamidipaka |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0048744 A1 | 2/2008 | Fukuoka |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0197414 A1 | 8/2008 | Hoffman et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0102018 A1 | 5/2011 | Shionoiri et al. |
| 2011/0121878 A1 | 5/2011 | Kato et al. |
| 2011/0176357 A1 | 7/2011 | Koyama et al. |
| 2011/0187410 A1 | 8/2011 | Kato et al. |
| 2012/0140550 A1 | 6/2012 | Endo et al. |
| 2012/0250397 A1 | 10/2012 | Ohmaru |
| 2013/0243149 A1 | 9/2013 | Yamazaki |
| 2014/0078816 A1 | 3/2014 | Koyama et al. |
| 2014/0204645 A1 | 7/2014 | Ohmaru et al. |

(56) References Cited

U.S. PATENT DOCUMENTS

| | | | |
|---|---|---|---|
| 2014/0226394 | A1 | 8/2014 | Endo et al. |
| 2014/0269013 | A1 | 9/2014 | Tsutsui et al. |
| 2015/0070064 | A1 | 3/2015 | Endo et al. |

FOREIGN PATENT DOCUMENTS

| | | | |
|---|---|---|---|
| EP | 2226847 | A | 9/2010 |
| JP | 60-198861 | A | 10/1985 |
| JP | 63-210022 | A | 8/1988 |
| JP | 63-210023 | A | 8/1988 |
| JP | 63-210024 | A | 8/1988 |
| JP | 63-215519 | A | 9/1988 |
| JP | 63-239117 | A | 10/1988 |
| JP | 63-265818 | A | 11/1988 |
| JP | 05-251705 | A | 9/1993 |
| JP | 07-131299 | A | 5/1995 |
| JP | 08-264794 | A | 10/1996 |
| JP | 11-505377 | | 5/1999 |
| JP | 2000-044236 | A | 2/2000 |
| JP | 2000-150900 | A | 5/2000 |
| JP | 2002-076356 | A | 3/2002 |
| JP | 2002-289859 | A | 10/2002 |
| JP | 2003-086000 | A | 3/2003 |
| JP | 2003-086808 | A | 3/2003 |
| JP | 2004-103957 | A | 4/2004 |
| JP | 2004-273614 | A | 9/2004 |
| JP | 2004-273732 | A | 9/2004 |
| JP | 2011-171723 | A | 9/2011 |
| JP | 2012-134961 | A | 7/2012 |
| JP | 2012-257192 | A | 12/2012 |
| JP | 2013-009297 | A | 1/2013 |
| JP | 2013-175708 | A | 9/2013 |
| JP | 2014-007731 | A | 1/2014 |
| KR | 2012-0127601 | A | 11/2012 |
| KR | 2013-0105480 | A | 9/2013 |
| TW | 201203522 | | 1/2012 |
| TW | 201234377 | | 8/2012 |
| TW | 201403302 | | 1/2014 |
| WO | WO-2004/114391 | | 12/2004 |
| WO | WO-2011/089847 | | 7/2011 |

OTHER PUBLICATIONS

International Search Report (Application No. PCT/IB2015/052384) Dated Jun. 2, 2015.
Written Opinion (Application No. PCT/IB2015/052384) Dated Jun. 2, 2015.
Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Clark.S et al., "First Principles Methods Using CASTEP", Zeitschrift fur Kristallographie, 2005, vol. 220, pp. 567-570.
Coates.D et al., "Optical Studies of the Amorphous Liquid-Cholesteric Liquid Crystal Transistion:The "Blue Phase"", Physics Letters, Sep. 10, 1973, vol. 45A, No. 2, pp. 115-116.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUs on Glass and Plastic Substrates Fabricated by TFT Transfer Technology", IEDM 05: Technical Digest of International Electron Devices Meeting, Dec. 5, 2005, pp. 1067-1069.
Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Ikeda.T et al., "Full-Functional System Liquid Crystal Display Using CG-Silicon Technology", SID Digest '04 : SID International Symposium Digest of Technical Papers, 2004,vol. 35, pp. 860-863.
Janotti.A et al., "Native Point Defects in ZnO", Phys. Rev. B (Physical Review. B), Oct. 4, 2007, vol. 76, No. 16, pp. 165202-1-1650202-22.
Janotti.A et al., "Oxygen Vacancies in ZnO", Appl. Phys. Lett. (Applied Physics Letters) , 2005, vol. 87, pp. 122102-1-122102-3.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kim.S et al., "High-Performance oxide thin film transistors passivated by various gas plasmas", 214th ECS Meeting, 2008, No. 2317, ECS.
Kimizuka.N et al., "Spinel,YBFe2O4, and YB2Fe3O7 Types of Structures for Compounds in the In2O3 and Sc2O3—A2O3—BO

(56) References Cited

OTHER PUBLICATIONS

Systems [A; Fe, Ga, or Al; B: Mg, Mn, Fe, Ni, Cu, or Zn] at Temperatures over 1000° C.", Journal of Solid State Chemistry, 1985, vol. 60, pp. 382-384.
Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUs on Flexible and Glass Substrates for Secure RFID Systems", Journal of Solid-State Circuits , 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED ", IDW '06 : Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=In, Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "SUFTLA Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B. (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Park.S et al., "Challenge to Future Displays: Transparent AM-OLED Driven by PEALD Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters) , Jun. 17, 1996, vol. 68, No. 25, pp. 3650-3652.
Sakata.J et al., "Development of 4.0-In. AMOLED Display With Driver Circuit Using Amorphous In—Ga—Zn-Oxide TFTs", IDW '09: Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs ", IDW '02 : Proceedings of the 9th International Display Workshops, Dec. 4, 2002, pp. 295-298.

(56) References Cited

OTHER PUBLICATIONS

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

HOLDING CIRCUIT, DRIVING METHOD OF THE HOLDING CIRCUIT, AND SEMICONDUCTOR DEVICE INCLUDING THE HOLDING CIRCUIT

TECHNICAL FIELD

One embodiment of the present invention relates to a holding circuit, a sequential circuit, and other semiconductor devices capable of holding a state or data, a driving method thereof, a manufacturing method thereof, and the like.

One embodiment of the present invention is not limited to the above technical field. The technical field of one embodiment of the invention disclosed in the specification, the drawings, and the claims (hereinafter referred to as "this specification and the like") relates to an object, a method, or a manufacturing method. One embodiment of the present invention relates to a process, a machine, manufacture, or a composition of matter. Examples of the technical field of one embodiment of the present invention disclosed in this specification include a semiconductor device, a display device, a liquid crystal display device, a light-emitting device, a lighting device, a power storage device, a memory device, a processing device, a method for driving any of them, and a method for manufacturing any of them.

BACKGROUND ART

To reduce the power consumption of a semiconductor device, unnecessary operation of circuits is stopped by power gating or clock gating. A flip-flop circuit (FF) is a sequential circuit (memory circuit that holds a state) included a lot in a semiconductor device. Thus, a reduction in power consumption of the FF leads to a reduction in power consumption of the whole semiconductor device incorporating the FF. When a general FF is simply powered off, a state (data) held therein is lost.

By taking advantage of an extremely low off-state current of a transistor whose semiconductor region is formed using an oxide semiconductor layer (hereinafter, such a transistor may be referred to as an OS transistor), a holding circuit capable of holding a state (data) even when powered off has been proposed. According to Patent Documents 1 to 3, for example, an FF incorporates a holding circuit including an OS transistor, leading to power gating of the FF.

REFERENCE

Patent Document
  [Patent Document 1] Japanese Published Patent Application No. 2012-257192
  [Patent Document 2] Japanese Published Patent Application No. 2013-009297
  [Patent Document 3] Japanese Published Patent Application No. 2013-175708

DISCLOSURE OF INVENTION

An object of one embodiment of the present invention is to provide a novel holding circuit, a novel sequential circuit, another novel semiconductor device, a novel driving method thereof, or a novel manufacturing method thereof. An object of one embodiment is, for example, to provide a semiconductor device whose power consumption can be reduced or a semiconductor device whose overhead can be prevented from being increased.

Objects other than the above objects will be apparent from the description in this specification and the like, and other objects of embodiments of the present invention can be extracted. In the descriptions of a plurality of objects, one object does not preclude the existence of another object. In addition, there is no need for one embodiment of the present invention to achieve all the objects.

One embodiment of the present invention is a holding circuit including a first input terminal, a second input terminal, a third input terminal, a first output terminal, a first switch, a second switch, a third switch, a capacitor, and a first node. The first switch controls conduction between the first node and the first input terminal The second switch controls conduction between the first node and the first output terminal.

The third switch controls conduction between the second input terminal and the first output terminal. A first terminal of the capacitor is electrically connected to the first node. A second terminal of the capacitor is electrically connected to the third input terminal The first and second switches are each a transistor whose semiconductor region is formed using an oxide semiconductor layer.

In the above structure, the third switch may be a transistor whose semiconductor region is formed using an oxide semiconductor layer. In that case, the oxide semiconductor layer preferably includes a crystal part with c-axis alignment.

In this specification and the like, ordinal numbers such as first, second, and third are used to avoid confusion among components, and the terms do not limit the components numerically.

In this specification and the like, a semiconductor device refers to a device that utilizes semiconductor characteristics, and means a circuit including a semiconductor element (e.g., a transistor or a diode), a device including the circuit, and the like. The semiconductor device also means any device that can function by utilizing semiconductor characteristics. For example, an integrated circuit and a chip including an integrated circuit are all semiconductor devices. Moreover, a memory device, a display device, a light-emitting device, a lighting device, an electronic device, and the like themselves might be semiconductor devices, or might each include a semiconductor device.

A transistor includes three terminals called a gate, a source, and a drain. The gate serves as a control terminal for controlling the on/off of the transistor. A pair of terminals other than the gate serves as input and output terminals of the transistor; one serves as a source and the other serves as a drain depending on the conductivity type of the transistor and potentials applied to the three terminals of the transistor. In general, in an n-channel transistor, a terminal to which a lower potential is applied is called a source, and a terminal to which a higher potential is applied is called a drain. In contrast, in a p-channel transistor, a terminal to which a lower potential is applied is called a drain, and a terminal to which a higher potential is applied is called a source. Thus, the functions of two terminals other than the gate might interchange depending on the potentials input to the three terminals of the transistor. For this reason, in this specification and the like, one of two terminals serving as a source and a drain of a transistor is called a first terminal and the other is called a second terminal, in some cases.

In this specification, to clarify a circuit configuration and circuit operation, one of input and output terminals of a transistor is fixed as a source and the other is fixed as a drain in some cases. It is needless to say that, depending on a driving method, the magnitude relationship between potentials applied to three terminals of the transistor might be changed, and the source and the drain might be interchanged. Thus, in one embodiment of the present invention, the distinction between the source and drain of the transistor is not limited to that described in this specification and the drawings.

One embodiment of the present invention can provide a novel holding circuit, a novel sequential circuit, another novel semiconductor device, a novel driving method thereof, or a novel manufacturing method thereof. As a result, for example, power consumption of a semiconductor device can be reduced. Alternatively, area overhead and performance overhead due to addition of a function of holding data in power gating can be reduced. For example, area overhead or performance overhead can be zero.

The description of these effects does not preclude the existence of other effects. In one embodiment of the present invention, there is no need to achieve all the effects. Furthermore, one embodiment of the present invention is not limited by these effects.

For example, depending on circumstances or conditions, one embodiment of the present invention might not produce these effects or might produce an effect other than these effects. In one embodiment of the present invention, an object other than the above objects, an effect other than the above effects, and a novel structure will be apparent from the description in the specification and the like.

BRIEF DESCRIPTION OF DRAWINGS

FIG. 8A is a top view, FIG. 8B is a cross-sectional view taken along line y1-y2, FIG. 8C is a cross-sectional view taken along line x1-x2, and FIG. 8D is a cross-sectional view taken along line x3-x4.

FIG. 9A is a top view, FIG. 9B is a cross-sectional view taken along line y1-y2, FIG. 9C is a cross-sectional view taken along line x1-x2, and FIG. 9D is a cross-sectional view taken along line x3-x4.

BEST MODE FOR CARRYING OUT THE INVENTION

Figure 1:
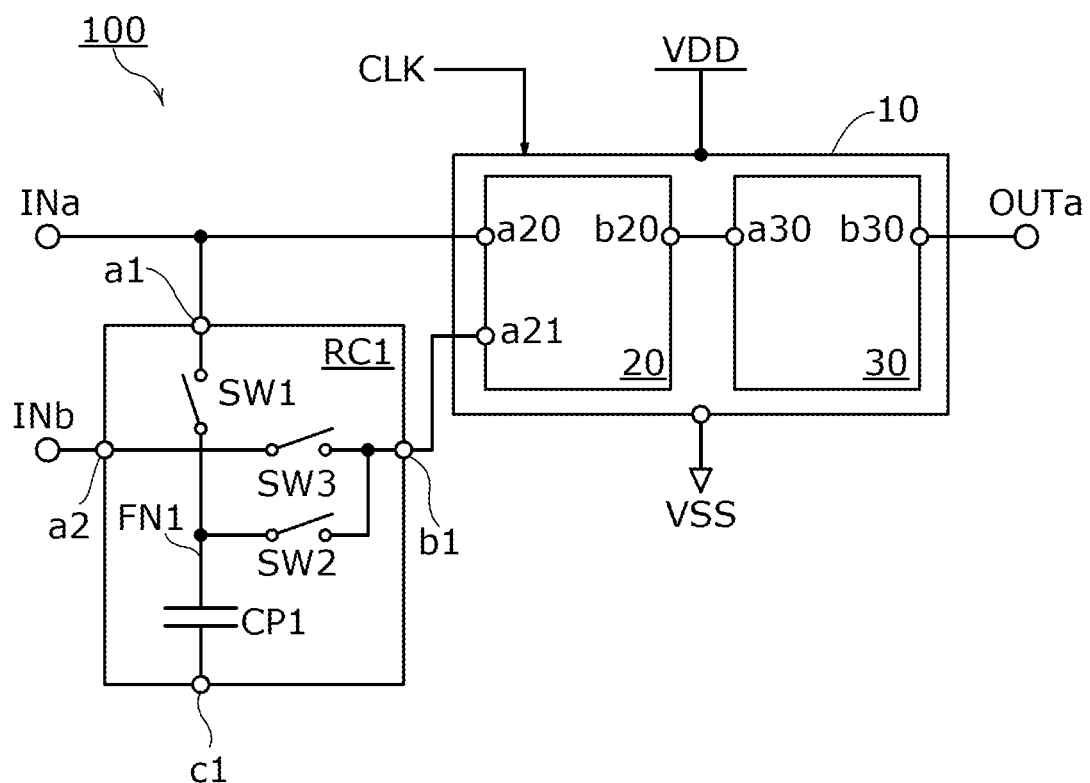
FIG. 1 is a block diagram illustrating a configuration example of a semiconductor device.

Embodiments of the present invention will be described in detail with reference to drawings. Note that the present invention is not limited to the following descriptions and it will be readily appreciated by those skilled in the art that modes and details can be modified in various ways without departing from the spirit and the scope of the present invention. Therefore, the present invention should not be construed as being limited to the descriptions of the embodiments below.

In addition, the same portions or portions having similar functions in the drawings used for the description of embodiments of the present invention are denoted by the same reference numerals, and the description thereof is not repeated in some cases.

In this specification, for example, clock signal CLK is abbreviated to a "signal CLK", "CLK", or the like in some cases. The same applies to other components (e.g., signal, voltage, potential, circuit, element, electrode, and wiring).

Some embodiments will be described below. A structure described in one embodiment can be combined with any of those described in the other embodiments as appropriate. In addition, in the case where some structure examples are described in one embodiment, any of the structure examples can be combined as appropriate.

Embodiment 1

Configuration Example 1 of Semiconductor Device

FIG. 1 is a block diagram illustrating a configuration example of a semiconductor device. A semiconductor device 100 includes an input terminal INa, an input terminal INb, an output terminal OUTa, a circuit 10, and a circuit RC1. The terminals INa and INb can input a data signal to be processed by the semiconductor device 100. The terminal OUTa outputs a data signal processed by the semiconductor device 100 (the circuit 10).

Circuit 10

The circuit 10 includes a circuit 20 and a circuit 30. The circuit 10 is a semiconductor device that can serve as a logic circuit. A control signal such as a clock signal CLK, a high power supply potential VDD, and a low power supply potential VSS are input to the circuit 10. The circuit 10 is a circuit block that can use clock gating and power gating. The supply of the clock signal CLK is controlled by a clock gating circuit of a semiconductor device in which the semiconductor device 100 is incorporated, and the supply of the power supply potential VDD is controlled by a power gating circuit of the semiconductor device.

The circuit 20 can serve as a selection circuit, and has a function of selecting one of an input signal from an input terminal a20 and an input signal from an input terminal a21 to output from an output terminal b20. The terminal a20 is electrically connected to the terminal Na, the terminal a21 is electrically connected to an output terminal b1 of the circuit RC1, and the terminal b20 is electrically connected to an input terminal a30 of the circuit 30. An output terminal b30 of the circuit 30 is electrically connected to the terminal OUTa.

The circuit 30 can be a circuit capable of holding data (state). A typical example of the circuit 30 is a sequential circuit. In that case, a logic level of a data signal output from the terminal b30 is determined by a data signal input to the terminal a30 or by the data signal and data (state) held in the circuit 30. The circuit 30 can be, for example, a sequential circuit such as a latch circuit, a flip-flop circuit, a shift register, a counter circuit, or a divider circuit.

Circuit RC1

The circuit RC1 serves as a holding circuit capable of holding data (state). The circuit RC1 includes a node FN1, an input terminal a1, an input terminal a2, an input terminal c1, the output terminal b1, a switch SW1, a switch SW2, a switch SW3, and a capacitor CP1.

The node FN1 is provided such that it can be electrically floating, and is a node serving as a data (state) holding portion of the circuit RC1. The terminal a1 is electrically connected to the terminal Na and the terminal a2 is electrically connected to the terminal INb.

The switch SW1 can control conduction between the node FN1 and the terminal a1. The switch SW2 can control conduction between the node FN1 and the terminal b1. The switch SW3 can control conduction between the terminal a2 and the terminal b1. A first terminal and a second terminal of the capacitor CP1 are electrically connected to the node FN1 and the terminal c1, respectively. The node FN1 and the terminal c1 are capacitively coupled by the capacitor CP1. Thus, the potential of the node FN1 can be controlled by the potential of the terminal c1. When the node FN1 is electrically floating, for example, an increase in the potential of the terminal c1 can boost the potential of the node FN1.

The circuit RC1 has a function of selecting one of data input from the terminal a1 and data input from the terminal a2 and holding the selected data in the node FN1, and a function of outputting data held in the node FN1 from the terminal b1. For writing of data input from the terminal a1, the switch SW1 is turned on and the switches SW2 and SW3 are turned off. For writing of data input from the terminal a2, the switches SW2 and SW3 are turned on and the switch SW1 is turned off. For data reading, the switch SW2 is turned on and the switches SW1 and SW3 are turned off. For data holding, the switches SW1 and SW2 are turned off and the node FN1 is made electrically floating.

The electrostatic capacitance of the capacitor CP1 is set considering the load of a node (node corresponding to the terminal a30 in the case of FIG. 1) to which data held in the RC1 is written.

The circuit RC1 can serve as a backup memory circuit for data held in the circuit 10. For this reason, the circuit RC1 has retention characteristics such that stored data can be held while powered off. To hold data in the RC1 for a long time, a potential change (in particular, a potential drop) of the electrically floating node FN1 is preferably reduced as much as possible. A means of achieving this is to use a transistor with extremely low drain current in an off state (off-state current) as each of the switches SW1 and SW2.

To reduce off-state current of a transistor, a semiconductor region contains a semiconductor with a wide energy gap, for example. In that case, the energy gap of the semiconductor is preferably greater than or equal to 2.5 eV, greater than or equal to 2.7 eV, or greater than or equal to 3 eV. An example of such a semiconductor is an oxide semiconductor. The switches SW1 and SW2 are each a transistor (OS transistor) whose semiconductor region is formed using an oxide semiconductor layer, for example. The leakage current of an OS transistor normalized on the channel width can be, for example, lower than or equal to $10 \times 10^{-21}$ A/μm (10 zA/μm) with a source-drain voltage of 10 V at room temperature (approximately 25° C.). It is preferred that the leakage current of the OS transistor used as each of the switches SW1 and SW2 be lower than or equal to $1 \times 10^{-18}$ A, lower than or equal to $1 \times 10^{-21}$ A, or lower than or equal to $1 \times 10^{-24}$ A at room temperature (approximately 25° C.). Alternatively, the leakage current is preferably lower than or equal to $1 \times 10^{-15}$ A, lower than or equal to $1 \times 10^{-18}$ A, or lower than or equal to $1 \times 10^{-21}$ A at 85° C.

Avalanche breakdown or the like is less likely to occur in some cases in an OS transistor than in a general transistor including silicon or the like, because an oxide semiconductor has a wide energy gap and thus electrons are less likely to be excited, and the effective mass of a hole is large. Since hot-carrier degradation or the like due to the avalanche breakdown is inhibited, the OS transistor has high drain withstand voltage and can be driven at high drain voltage. Accordingly, the use of the OS transistor in the circuit RC1 can leave a wide margin for driving conditions such as the potential level of a signal and input timing. The circuit RC1 can be driven such that the potential of the node FN1 is high when data is held, for example.

Furthermore, the OS transistor can have excellent off-state current characteristics and subthreshold characteristics even with a gate insulating layer with an equivalent oxide thickness of about 11 nm and a short channel length of 50 nm. Since a gate insulating layer in the OS transistor can be thicker than that in a Si transistor generally used in a logic circuit, leakage current through the gate insulating layer can be reduced and a variation in electric characteristics due to a variation in the thickness of the gate insulating layer can be suppressed. The details of the OS transistor will be described in Embodiment 2.

There is no particular limitation on the switch SW3 and a transistor included in the circuit 10, and a general transistor included in a logic circuit can be used; for example, a transistor whose semiconductor region contains a Group 4 element (Si, Ge, or C) can be used. A typical example of the transistor in the circuit 10 is a transistor whose semiconductor region contains silicon (Si transistor). For the purpose of improving the mobility of the Si transistor or for other purposes, a distortion transistor obtained by addition of Ge to a semiconductor region of a Si transistor may be used.

The switch SW3 may be an OS transistor like the switches SW1 and SW2, or a switch circuit such as an analog switch. When an OS transistor is used as the switch SW3, area overhead of the semiconductor device 100 due to addition of the circuit RC1 can be zero as described below. In contrast, when an analog switch is used as the switch SW3, a Si transistor is used for a p-channel transistor, an OS transistor is used for an n-channel transistor, and the n-channel transistor is stacked over the p-channel transistor, in which case the area of the semiconductor device 100 can be reduced as compared to the case where the switch SW3 is formed using only Si transistors.

In the semiconductor device 100, a change in the circuit configuration of the circuits 20 and 30 due to the provision of the circuit RC1 is unnecessary. Furthermore, a general selection circuit such as a selector or a multiplexer can be used as the circuit 20. In addition, a general sequential circuit such as a latch circuit or a flip-flop circuit can be used as the circuit 30. Since the circuit RC1 can be stacked over the circuits 20 and 30, the circuit RC1 can be provided almost without a layout change of the circuits 20 and 30. In this embodiment, a circuit block including an OS transistor is stacked over a circuit block including a selection circuit and a sequential circuit, whereby area overhead due to the addition of the circuit block including an OS transistor and a performance penalty during normal operation of the selection circuit and the sequential circuit can be zero.

Examples of specific circuit configuration and a driving method of the semiconductor device 100 will be described below.

Configuration Example 2 of Semiconductor Device

Figure 2:
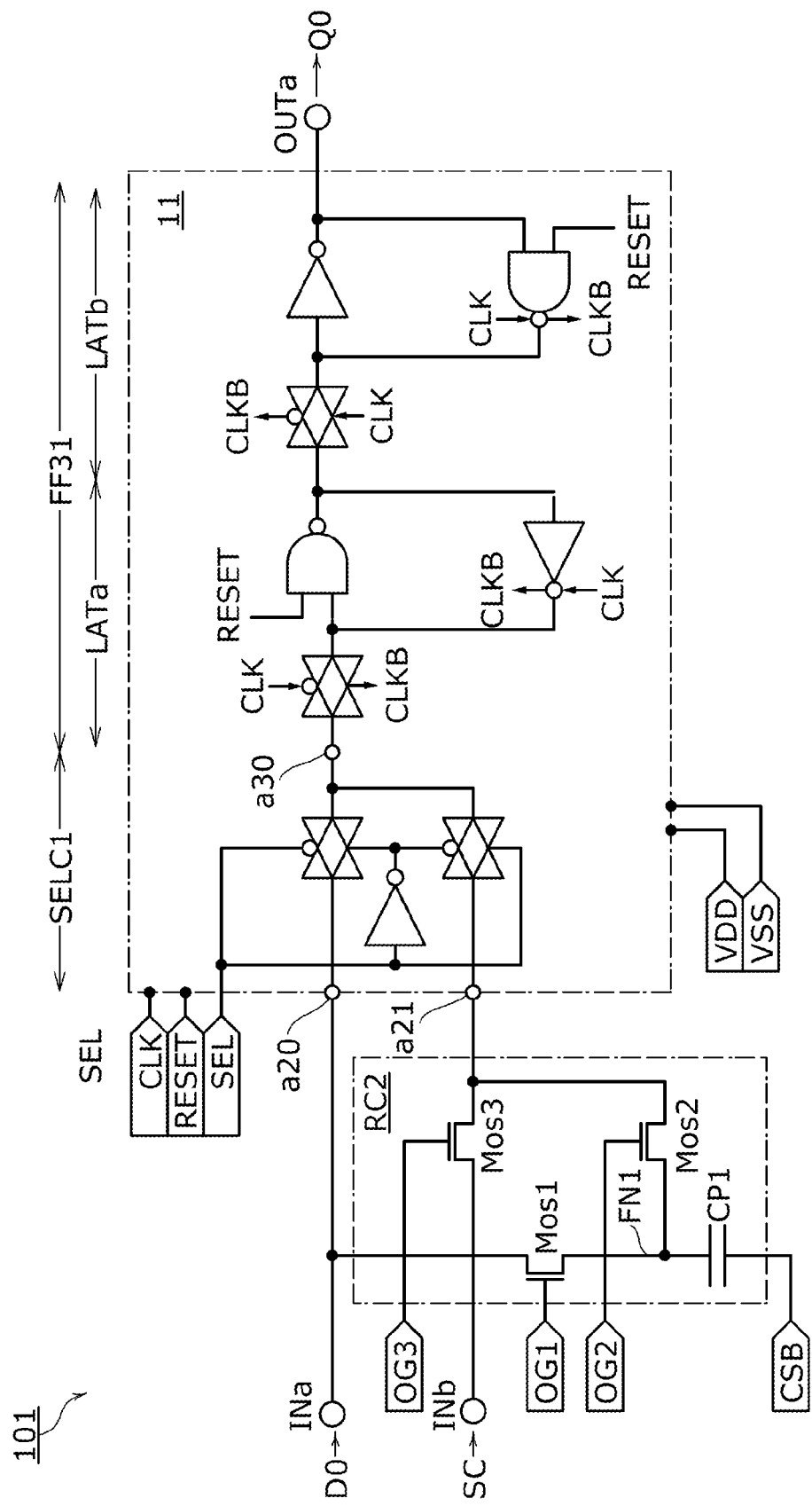
FIG. 2 is a circuit diagram illustrating a configuration example of a semiconductor device.
Figure 3:
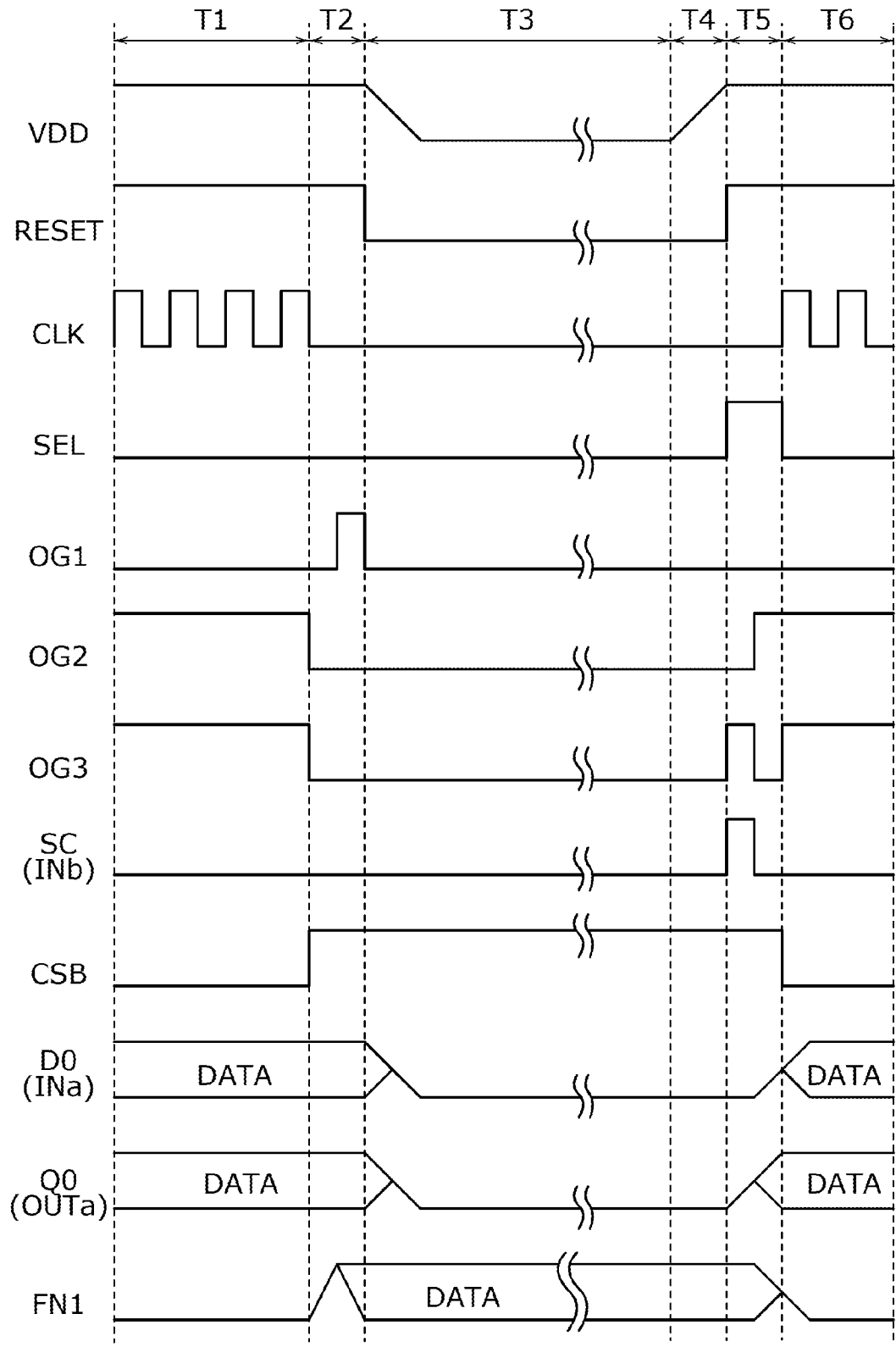
FIG. 3 is a timing chart showing an example of a method for driving a semiconductor device.
Figure 4:
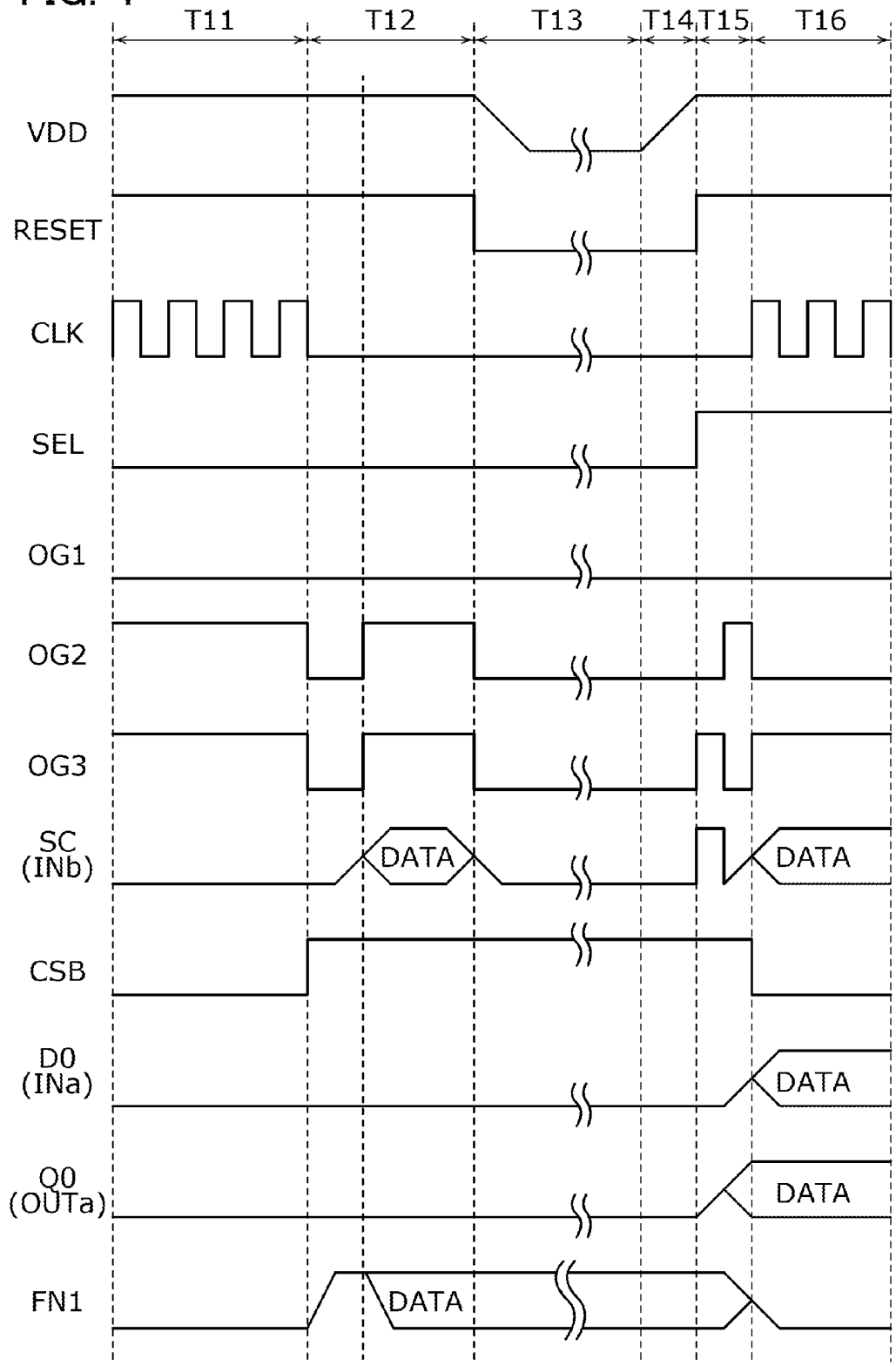
FIG. 4 is a timing chart showing an example of a method for driving a semiconductor device.

FIG. 2 is a circuit diagram illustrating a configuration example of a semiconductor device. FIG. 3 and FIG. 4 are each a timing chart showing examples of a driving method of the semiconductor device illustrated in FIG. 2. The circuit diagram in FIG. 2 is a specific example of the semiconductor device 100 illustrated in FIG. 1. A semiconductor device 101 illustrated in FIG. 2 includes a circuit 11 and a circuit RC2.

The circuit 11 is a circuit block corresponding to the circuit 10 in FIG. 1. The circuit 11 includes a circuit SELC1 and a flip-flop circuit (FF) 31.

The SELC1 can serve as a selection circuit and includes one inverter (NOT gate) circuit and two analog switch circuits. To the SELC1, a signal SEL as a control signal and power supply potentials VDD and VSS are input.

To the FF 31, a clock signal CLK and a reset signal RESET are input as control signals and VDD and VSS are input as power supply potentials. A signal CLKB is an inverted signal of CLK and is generated from CLK by an inverter circuit or the like provided in the circuit 11. In FIG. 2, the FF 31 is a master-slave FF and includes two latch circuits (LATa and LATb). The LATa includes one analog switch, one NAND gate circuit, and one clocked inverter circuit. The LATb includes one analog switch, one inverter circuit, and one clocked NAND gate circuit. In the FF 31, one analog switch and one inverter circuit may be provided instead of the clocked inverter circuit, and one analog switch and a NAND gate circuit may be provided instead of the clocked NAND gate circuit.

The circuit RC2 corresponds to the circuit RC1 in FIG. 1. A transistor Mos1, a transistor Mos2, and a transistor Mos3 serving as SW1, SW2, and SW3, respectively, are n-channel transistors and OS transistors. Signals OG1 to OG3 are control signals for controlling on/off of the transistors Mos1 to Mos3. A signal CSB is input to a second terminal of the capacitor CP1.

The semiconductor device 101 illustrated in FIG. 2 can serve as a scan flip-flop circuit, for example, and a plurality of semiconductor devices 101 can form a scan chain.

In that case, the terminal Na is used as a data input terminal for normal operation and the terminal INb is used as an input portion of the scan chain. To form a scan chain, the input terminal INb of one of adjacent two semiconductor devices 101 is electrically connected to the output terminal OUTa of the other semiconductor device 101. The input terminal Na of each of the plurality of semiconductor devices 101 is connected to an output terminal of a combinational circuit.

The semiconductor device 101 can be used as, for example, a logic element of a programmable logic device (PLD) such as an FPGA. A circuit block having a register included in the logic element and a selection circuit for selecting an input signal of the register may be formed using the circuit 11. In that case, a plurality of semiconductor devices 101 can form a register chain having a backup function.

The semiconductor device 101 can use clock gating and power gating; thus, supply of CLK and VDD to the circuit 11 can be stopped for a period during the operation of the circuit 11 is unnecessary for the semiconductor device in which the circuit 11 is incorporated. As a result, dynamic power consumption of the semiconductor device 101 can be reduced. Hereinafter, examples of a driving method of the semiconductor device 101 will be described with reference to FIG. 3 and FIG. 4.

FIG. 3 and FIG. 4 show waveforms of control signals OG1 to OG3, CSB, CLK, RESET, and SEL, input signals D0 and SC, and an output signal Q0; a potential change of the node FN1; and a potential change of an input terminal for the power supply potential VDD of the circuit 11. For the signals OG1 to OG3, CSB, CLK, RESET, SEL, D0, and SC input to the semiconductor device 101, a high (H) level potential is VDD and a low (L) level potential is VSS in the examples in FIG. 3 and FIG. 4.

Example 1 of Driving Method of Semiconductor Device

FIG. 3 shows an example of a method for controlling clock gating and power gating.

Period T1

In Period T1, the semiconductor device 101 operates in a normal operation mode. In the normal operation, the semiconductor device 101 (circuit 11) operates as a flip-flop circuit. In the example shown in FIG. 3, the semiconductor device 101 in the normal operation operates so that the state of the signal D0 is held in the FF 31.

Note that VDD and CLK are supplied to the circuit 11. Since the potential of the signal SEL is at an L level, conduction between the terminal Na and the input terminal a30 of the FF 31 are established through the SELC1. The state of the FF 31 (output signal Q0) changes depending on the signal CLK and the signal D0 input from the terminal a30.

In the normal operation, the potential of the node FN1 is held at a potential at which a logic level becomes "L". Here, the logic level of the node FN1 is held at "L" utilizing the signal SC input from the terminal INb. Specifically, the potential of SC is set at an L level (VSS) and the transistors Mos2 and Mos3 are turned on. Accordingly, the potential of the node FN1 becomes VSS. That is, in the normal operation, the node FN1 is precharged using the signal SC. Note that the L level potential of SC is not limited to VSS; however, when the L level potential of SC is VSS, the signal SC can be generated without increasing the number of kinds of power supply potentials to be used.

Period T2

In Period T2, VDD is supplied but CLK is not supplied, whereby the semiconductor device 101 is in a standby state. The RC2 backs up the state of the FF 31. Specifically, the logic level of the data signal D0 input to the FF 31 is written to the RC2.

First, the transistors Mos2 and Mos3 are turned off to make the node FN1 electrically floating and the signal CSB is set at an H level, so that the potential of the node FN1 is boosted to a potential at which the logic level becomes "H". Then, the transistor Mos1 is turned on so that the signal D0 is input to the node FN1. When the logic level of the signal D0 is "L", the charge of the node FN1 is extracted to the terminal Na; thus, the potential of the node FN1 drops and the logic level of the node FN1 becomes "L". When the logic level of the signal D0 is "H", the charge of the node FN1 is stored and the logic level of the node FN1 is kept "H".

As described above, the charge of the node FN1 moves during the backup operation of the RC2 because of precharge operation for making the logic level of the node FN1 "L" and boosting operation of the node FN1 due to capacitive coupling only when data L is written. Thus, the backup operation can be carried out at high speed, which enables supply of VDD to be stopped in a short time after supply of CLK is stopped. In addition, a voltage drop of the node FN1 due to the threshold voltage of the transistor Mos1 does not occur in the case of writing data H. As a result, the H level potential of the control signal OG1 of the transistor Mos1 needs not to be set higher than VDD.

After the transistor Mos1 is turned on for a certain period, the transistor Mos1 is turned off to make the node FN1 electrically floating. In this manner, backup of the FF 31 is completed.

In the example shown in FIG. 3, OG1 is set at an H level after CSB. However, CSB and OG1 may be changed to an H level concurrently, for example, in which case the time necessary for the backup operation can be reduced.

Period T3

In Period T3, supply of VDD is stopped and the semiconductor device 101 is stopped. After OG1 and RESET are set at L levels, supply of VDD is stopped.

Period T4

To make the semiconductor device 101 in the normal operation again, first, supply of VDD is resumed. When supply of VDD is resumed, conduction between the terminal a20 and the terminal a30 are established through the SELC1.

Period T5

The FF 31 is restored to a state before supply of CLK is stopped. Specifically, data held in the RC2 is written to the FF 31. First, SEL and 0G3 are set at H levels so that conduction between the terminal INb and the input terminal a30 of the FF 31 are established, and the signal SC is set at an H level. Accordingly, the logic level of the terminal a30 becomes "H". Next, the transistor Mos2 is turned on so that conduction between the node FN1 and the terminal a30 are established. When the logic level of the node FN1 is "L", the potential of the terminal a30 becomes at an L level; thus, the logic level of the terminal a30 becomes "L". When the logic level of the node FN1 is "H", the potential of the terminal a30 hardly changes; thus, the logic level of the terminal a30 is kept "H". In the above manner, the state of the FF 31 can be set to a state held in the node FN1. This means that the FF 31 can be restored to a state just before supply of CLK is stopped.

As described above, since data held in the RC2 is written to the FF 31 after the logic level of the terminal a30 is set "H" during the restoration operation of the RC2, the charge of the node FN1 moves only when data L is written to the FF 31. As a result, the restoration operation can be carried out at high speed, which enables the semiconductor device 101 to operate normally in a short time after supply of VDD is resumed. In addition, a voltage drop of the terminal a30 due to the threshold voltage of the transistor Mos2 does not occur in the case of writing data H. Thus, the H level potential of the control signal 0G2 of the transistor Mos2 needs not to be set higher than VDD.

Operation of setting the logic level of the terminal a30 to "H" is not affected by the circuit configuration of the FF 31 or a state at the time when power supply is stopped. This means that any of a variety of sequential circuits can be used as the circuit 11. As described above, the holding circuit of this embodiment can be widely used; thus, a data holding function for power gating can be added to a variety of sequential circuits.

Period T6

Supply of CLK is resumed so that the semiconductor device 101 operates normally. In Period T5, which is before supply of CLK is resumed, the signal RESET is set at an H level. The driving method of the semiconductor device 101 in Period T6 is similar to that in Period T1; thus, the description is omitted.

As described above, in the precharge operation of the node FN1, the storage operation of the RC2, and the restoration operation of the RC2, the threshold voltages of the transistors Mos1 to Mos3 do not affect the logic level of data written to the RC2 or the FF 31. Thus, even when the transistors Mos1 to Mos3 are OS transistors, the H level potentials of the control signals OG1 to 0G3 of these transistors can be the same potential as VDD of the circuit 11. In other words, even when the RC2 is provided in the semiconductor device 101, the number of kinds of potentials necessary for operation is not increased.

Example 2 of Driving Method of Semiconductor Device

In the example of a driving method shown in FIG. 3, the RC2 backs up the data signal D0 input to the terminal INa. The RC2 can also back up the signal SC input to the terminal INb. FIG. 4 shows an example of such a driving method. In the example of a driving method in FIG. 4, the description of the same operation as the example of a driving method in FIG. 3 is omitted; thus, for the description, refer to the description for FIG. 3.

Period T11

In Period T11, the semiconductor device 101 is in a normal operation mode. Period T11 is different from Period T1 in FIG. 3 in that the logic level of the signal D0 remains "L". It is needless to say that the signal D0 in Period T11 can be a data signal whose logic level changes as shown in FIG. 3.

Period T12

A data signal input to the terminal INb is backed up. After supply of CLK is stopped, first, the potential of the node FN1 is boosted so that the logic level of the node FN1 becomes "H". To achieve this, the transistors Mos1 to Mos3 are turned off and the signal CSB is set at an H level. Then, the transistors Mos2 and Mos3 are turned on and the signal SC is written to the node FN1.

Period T13

In Period T13, the semiconductor device 101 operates in a manner similar to that in Period T3 in FIG. 3; the transistors Mos2 and Mos3 are turned off, and supply of VDD is stopped. The RC2 holds data input to the terminal INb in Period T12.

Period T14, Period T15

The semiconductor device 101 operates in a manner similar to those in Periods T4 and T5 in FIG. 3; supply of VDD is resumed, data held in the RC2 is written to the input terminal a30 of the FF 31, and the state of the FF 31 is restored. Then, supply of CLK is resumed so that the semiconductor device 101 operates normally.

Period T16

In Period T16, the semiconductor device 101 operates normally. Period T16 is different from Period T6 in FIG. 3 in that conduction between the terminal INb and the terminal a21 are established through the transistor Mos3, and the signal SEL is set at an H level so that conduction between the terminal a30 and the terminal a21 are established through the SELC1. Thus, a data signal (SC) input to the terminal INb is input to the FF 31.

In the case where the semiconductor device 101 operates as a scan FF, for example, test data is input to the terminal INb in Period T12. Scan-in operation for inputting a test pattern to the semiconductor device 101 (RC1) may be performed in Period T12 and shift operation may be performed in Period T16, for example. In that case, the semiconductor device 101 operates as shown in FIG. 4, so that whether data held in the RC2 is normal or not can be determined from the logical value of the output signal Q0 of the circuit 11 (scan FF), and therefore whether the RC2 has a problem or not can be determined The example of a circuit configuration in FIG. 2 shows that a general scan flip-flop circuit including a selection circuit and a flip-flop circuit can be used as the circuit 11. The examples of a driving method in FIG. 3 and FIG. 4 show that the semiconductor device 101 can operate as a general scan FF.

Thus, the semiconductor device 101 of this embodiment can be a semiconductor device including a scan FF (the circuit 11) and a holding circuit (OS block) having an OS transistor. Since a general circuit can be used as the scan FF, changes in circuit configuration and layout due to addition of the OS block can be prevented. The OS block can be formed using an OS transistor and a capacitor and thus can be stacked over the scan FF. When the semiconductor device 101 has a three-dimensional structure in which the OS block is stacked over the scan FF, layout area overhead due to the addition of the OS block and a performance penalty during normal operation can be zero.

As described above, owing to the semiconductor device of this embodiment, dynamic power consumption of the semiconductor device 101 can be reduced by power gating almost without performance overhead and area overhead even when an OS block is added.

MODIFICATION EXAMPLES OF
SEMICONDUCTOR DEVICE

Some modification examples of the semiconductor device 100 (FIG. 1) will be described below.

Configuration Example 3

In FIG. 1, the input terminal a1 of the RC1 is electrically connected to the input terminal a20 (the input terminal INa) of the circuit 10. A connection node at which the terminal a1 is connected to the circuit 10 is not limited to the terminal a20 and can be, for example, the output terminal b20 of the circuit 20, the input terminal a30 of the circuit 30, the output terminal b30 of the circuit 30, or an internal node of the circuit 30.

In this case, the internal node of the circuit 30 is a node on a transmission path of a data signal between the terminal a30 and the terminal b30. In the case where the FF 31 illustrated in FIG. 2 is used as the circuit 30, for example, the internal node is an output terminal of the clocked inverter circuit in the LATa, an output terminal of the NAND gate circuit in the LATa, or an output terminal of the inverter circuit in the LATb.

Figure 5:
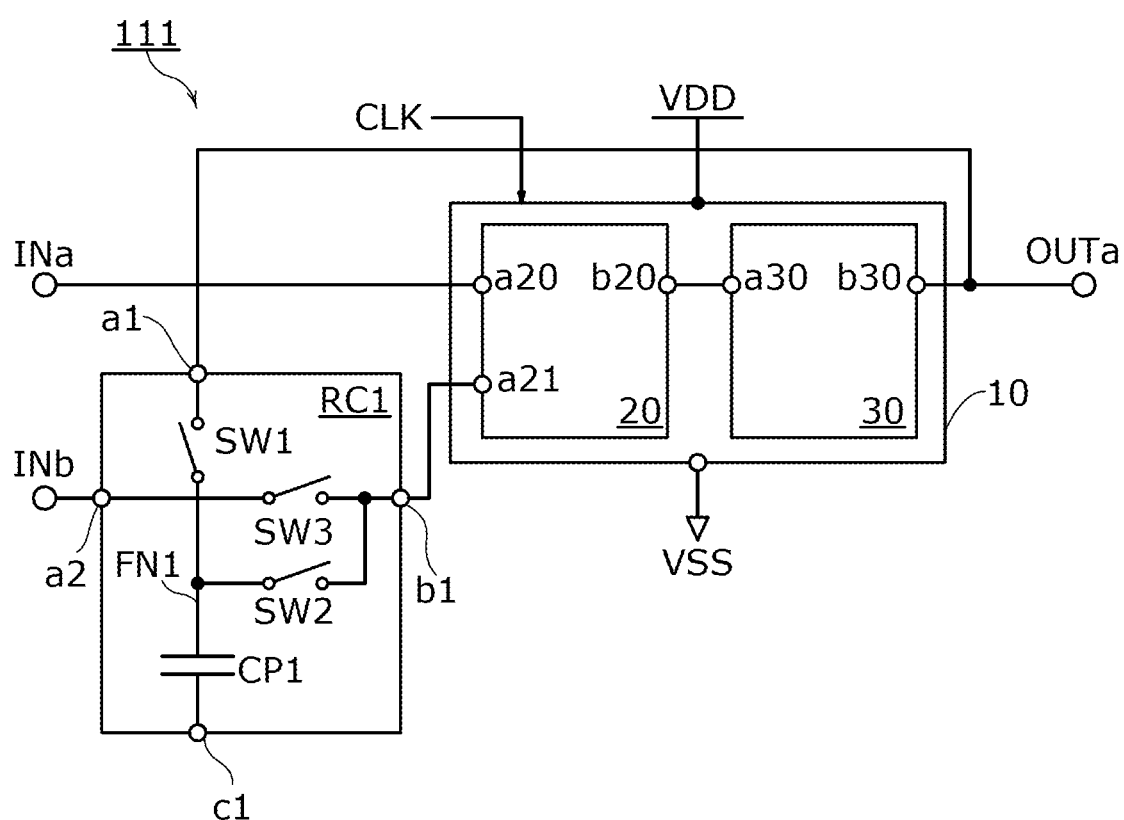
FIG. 5 is a block diagram illustrating a configuration example of a semiconductor device.

A semiconductor device 111 illustrated in FIG. 5 is an example where the terminal a1 is electrically connected to the terminal b30. Also in this configuration example, a change in the configuration or layout of the circuit 10 is unnecessary as illustrated in FIG. 5.

Configuration Example 4

The terminal a1 may be electrically connected to a buffer portion so as to compensate the logic level of a signal input to the terminal a1 of the RC1. The buffer portion can be one buffer circuit, cascaded buffer circuits, one inverter circuit, cascaded inverter circuits, or the like. In the case where data obtained by inverting the logic of the signal D0 needs to be held in the RC1 in FIG. 1 under constraints of the configuration of the circuit 10 and the like, an even number of inverter circuits are used as the buffer portion.

The terminal b1 may also be electrically connected to the buffer portion so as to compensate the logic level of an output signal from the terminal b1 of the RC1 or to invert the logic of the output signal.

Figure 6A:
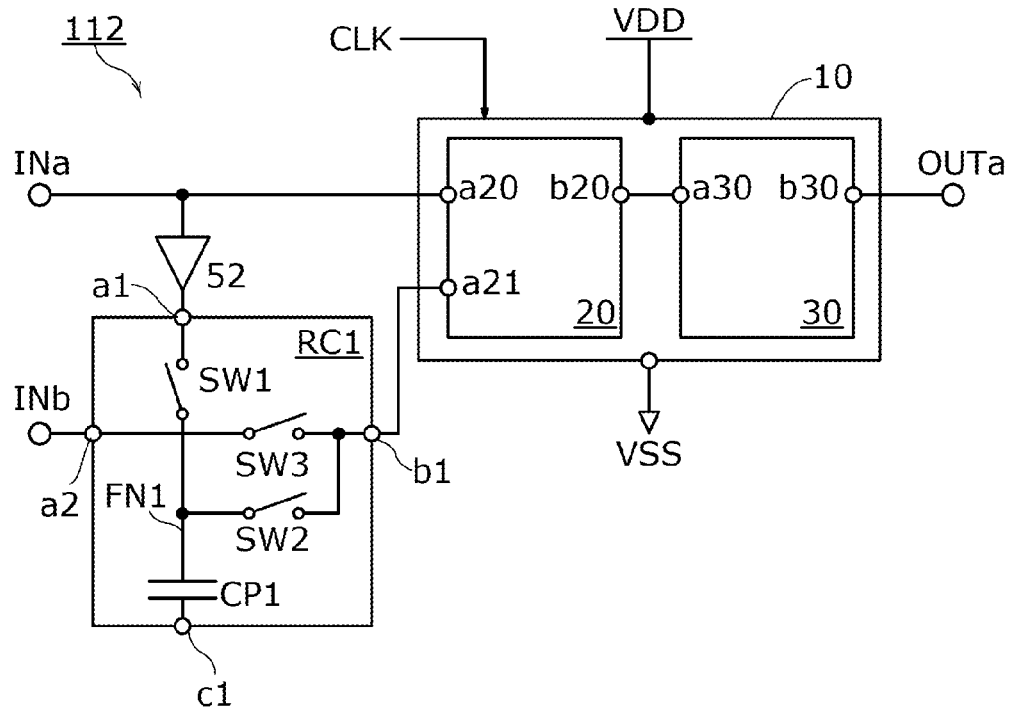
FIGS. 6A and 6B are each a block diagram illustrating a configuration example of a semiconductor device.
Figure 6B:
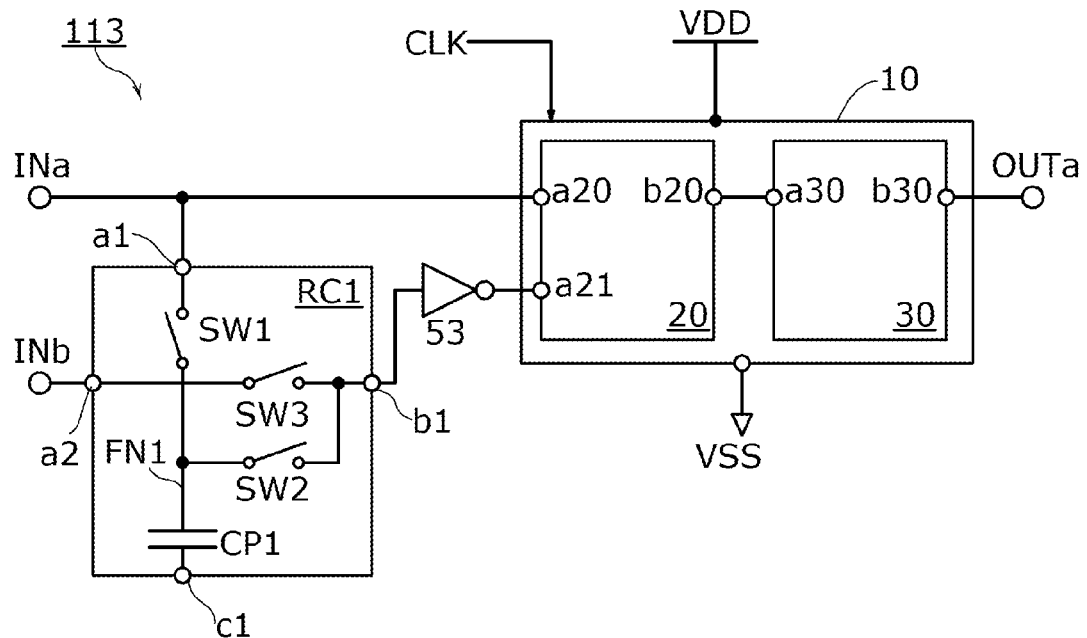

A semiconductor device 112 illustrated in FIG. 6A is an example where the terminal a1 is electrically connected to one buffer circuit 52. A semiconductor device 113 illustrated in FIG. 6B is an example where the terminal b1 is electrically connected to one inverter circuit 53.

Configuration Example 5

Figure 7:
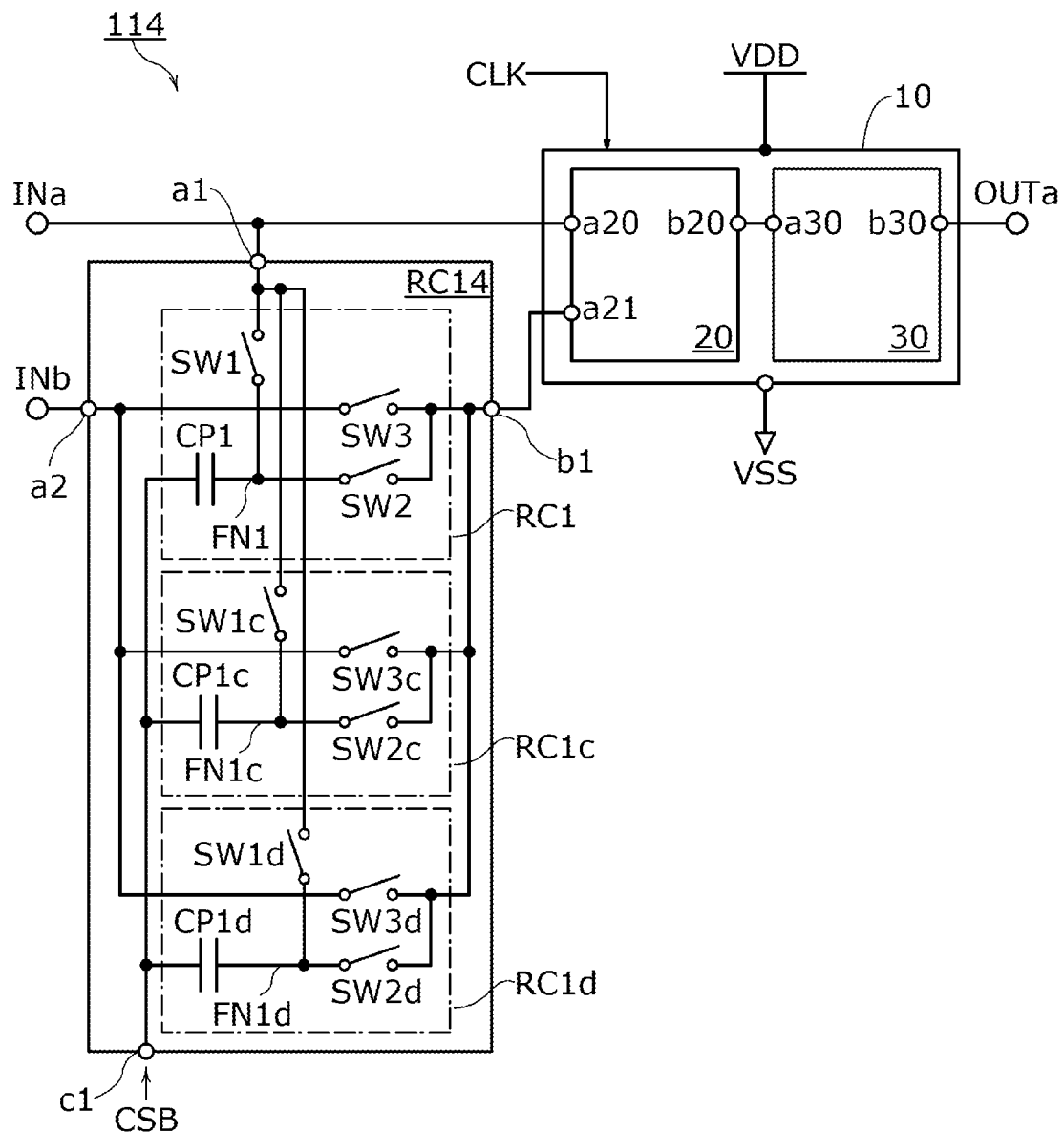
FIG. 7 is a block diagram illustrating a configuration example of a semiconductor device.

Although the circuit RC1 illustrated in FIG. 1 can hold one state, a holding circuit that can hold a plurality of states can be provided in the semiconductor device. FIG. 7 illustrates such a configuration example. A semiconductor device 114 illustrated in FIG. 7 includes a circuit RC14 instead of the circuit RC1, as a backup memory circuit for states.

The RC14 corresponds to the RC1 additionally including two circuits (RC1c and RC1d). Thus, the RC14 can hold three states. The RC1c and the RC1d have the same configuration as the RC1, and can be driven in a manner similar to that of the RC1. The RC1c and the RC1d can also hold data signals input from the terminals Na and INb and can write their holding states to the circuit 10. A node FN1c and a node FN1d are data holding nodes of the RC1c and the RC1d, respectively.

Switches SW1, SW1c, SW1d, SW2, SW2c, SW2d, SW3, SW3c, and SW3d in the RC14 are turned on/off independently. The switches SW1, SW1c, SW1d, SW2, SW2c, and SW2d are OS transistors. The switches SW3c and SW3d each can be an OS transistor or a switch circuit such as an analog switch like the SW3.

The signal CSB is input to second terminals of capacitors CP1, CP1c, and CP1d. Alternatively, different signals may be input to the second terminals of the capacitors CP1, CP1c, and CP1d, so that the potentials of the nodes FN1, FN1c, and FN1d can be boosted independently.

In normal operation of the semiconductor device 114, the state of the circuit 30 can be written to one of the holding circuits RC1, RC1c, and RC1d in the RC14. In other words, the RC14 can hold up to three states of the semiconductor device 114 (circuit 30) at a given period in normal operation.

Embodiment 2

In this embodiment, an OS transistor will be described as an example of a semiconductor device.

Structure Example 1 of OS Transistor

Figure 8A:
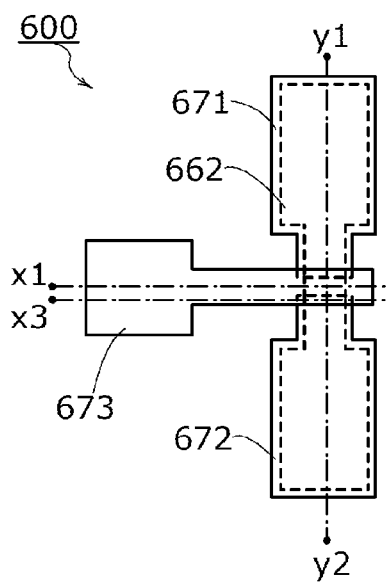
FIGS. 8A to 8D illustrate a structure example of an OS transistor.
Figure 8B:
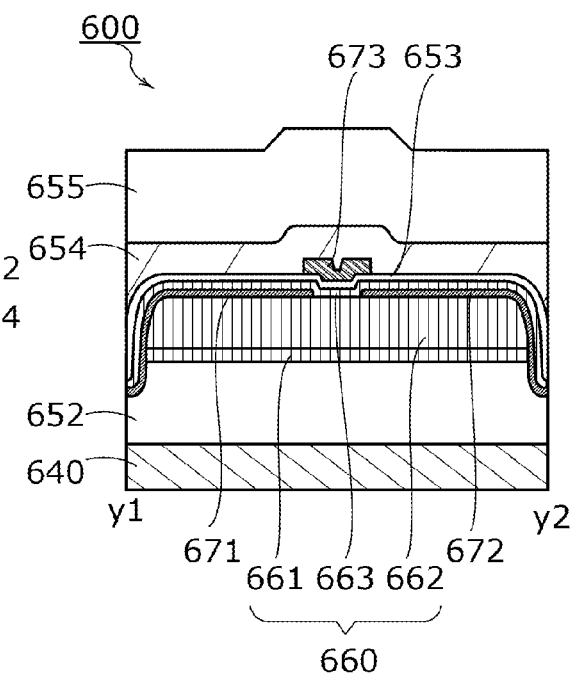
Figure 8C:
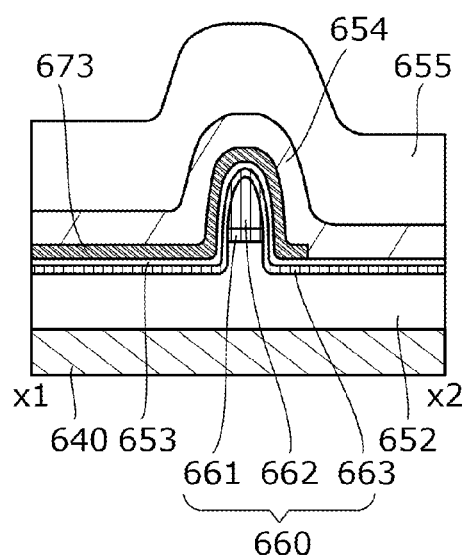
Figure 8D:
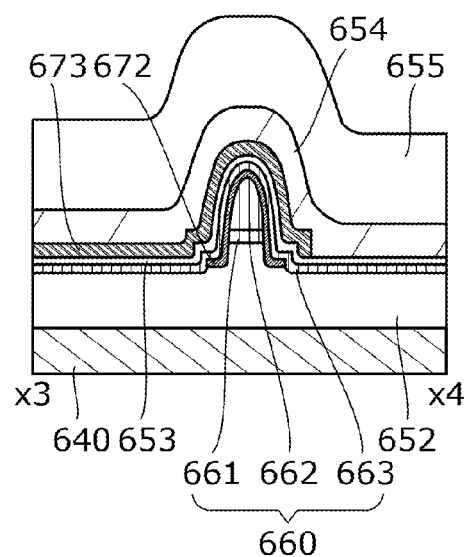

FIGS. 8A to 8D illustrate a structure example of an OS transistor. FIG. 8A is a top view illustrating a structure example of an OS transistor. FIG. 8B is a cross-sectional view taken along a line y1-y2, FIG. 8C is a cross-sectional view taken along a line x1-x2, and FIG. 8D is a cross-sectional view taken along a line x3-x4. To clarify the device structure, FIG. 8A does not illustrate some components. Here, in some cases, the direction of the line y1-y2 is referred to as a channel length direction, and the direction of the line x1-x2 is referred to as a channel width direction. Accordingly, FIG. 8B illustrates a cross-sectional structure of the OS transistor in the channel length direction, and FIGS. 8C and 8D each illustrate a cross-sectional structure of the OS transistor in the channel width direction.

As illustrated in FIGS. 8A to 8D, an OS transistor 600 is formed over a substrate 640 and is covered with an insulating layer 654 and an insulating layer 655. The OS transistor includes an insulating layer 652, a gate insulating layer 653, oxide semiconductor (OS) layers 661 to 663, an electrode 671, an electrode 672, and a gate electrode 673. Here, the OS layers 661, 662, and 663 are collectively referred to as an OS layer 660.

A stack including oxide semiconductor films in which the OS layer 661 and the OS layer 662 are stacked in this order is formed over the insulating layer 652. The electrodes 671 and 672 are electrically connected to the stack. The electrodes 671 and 672 can serve as source and drain electrodes of the OS transistor 600. The OS layer 663 covers the OS layers 661 and 662 and the electrodes 671 and 672. The gate insulating layer 653 is stacked over the OS layer 663. The gate electrode 673 overlaps with a portion where the OS layers 661 to 663 are stacked with the gate insulating layer 653 provided therebetween and overlaps with the electrodes 671 and 672 with a stack including the gate insulating layer 653 and the OS layer 663 provided therebetween.

Structure Example 2 of OS Transistor

Figure 9A:
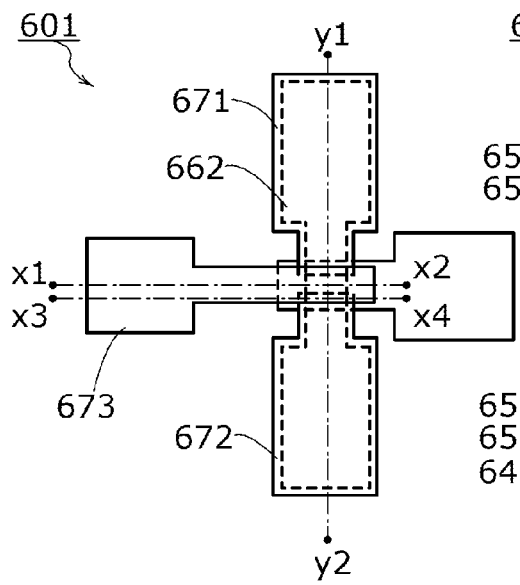
FIGS. 9A to 9D illustrate a structure example of an OS transistor.
Figure 9B:
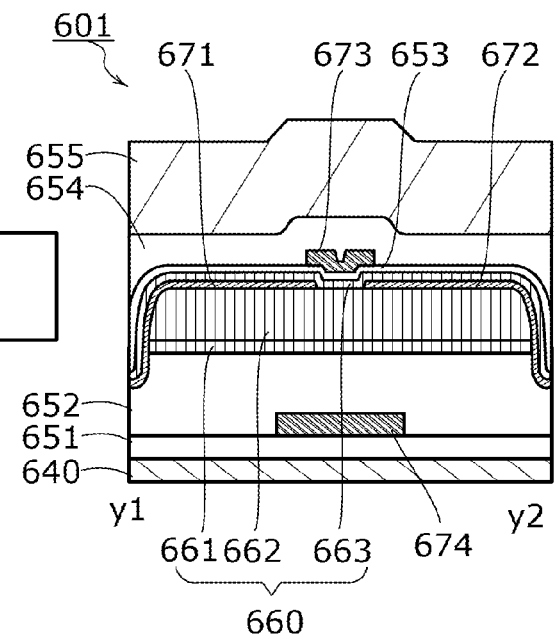
Figure 9C:
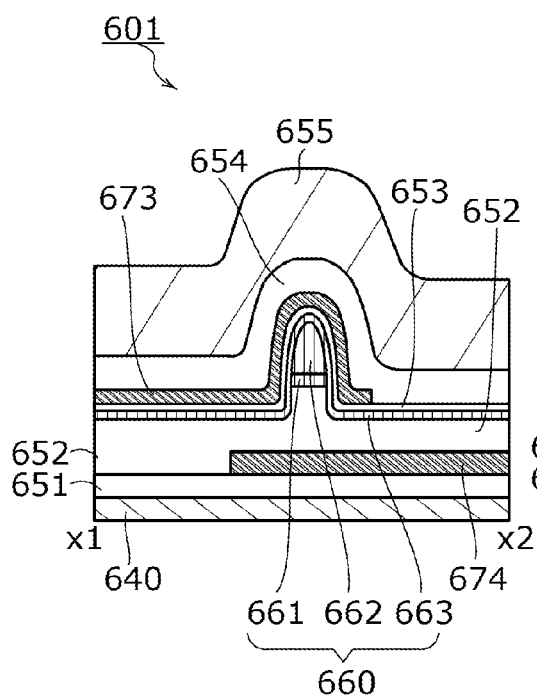
Figure 9D:
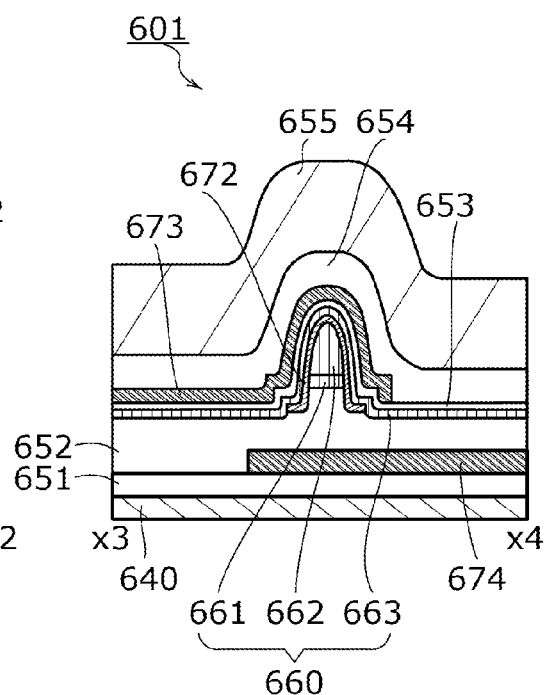

FIGS. 9A to 9D illustrate another structure example of an OS transistor. FIG. 9A is a top view illustrating a structure example of an OS transistor. FIG. 9B is a cross-sectional view taken along a line y1-y2, FIG. 9C is a cross-sectional view taken along a line x1-x2, and FIG. 9D is a cross-sectional view taken along a line x3-x4. To clarify the device structure, FIG. 9A does not illustrate some components.

An OS transistor 601 illustrated in FIGS. 9A to 9D corresponds to the OS transistor 600 having a second gate electrode. A conductive layer 674 is formed over the substrate 640 with an insulating layer 651 provided therebetween. The conductive layer 674 has a region serving as a gate electrode layer. The conductive layer 674 may be supplied with the same potential or signal as the gate electrode 673, or the potential of the conductive layer 674 may be controlled independently of the gate electrode 673. In the former, the gate electrode 673 may be electrically connected to the conductive layer 674.

The three-dimensional device structure like the structures of the OS transistors 600 and 601 can provide an OS transistor with a 60-nm or 30-nm technology node, or with an even smaller technology node. The components of the OS transistors 600 and 601 will be described below.
Oxide Semiconductor Layer Typical examples of a semiconductor material for the OS layers 661 to 663 include an In-Ga oxide, an In-Zn oxide, and an In-M-Zn oxide (M is Ti, Ga, Y, Zr, La, Ce, Nd, Sn, or Hf). The OS layer 660 is preferably an In-M-Zn oxide film. It is needless to say that the OS layers 661 to 663 are not limited to oxide films containing indium. The OS layers 661 to 663 can be formed using, for example, a Zn-Sn oxide film or a Ga-Sn film.

In the case where the OS layers 661 to 663 are each the In-M-Zn oxide film (M is Ti, Ga, Y, Zr, La, Ce, Nd, Sn, or Hf) formed by a sputtering method, it is preferred that the atomic ratio of metal elements of a target used for forming the In-M-Zn oxide film satisfy In≥M and Zn≥M. As the atomic ratio of metal elements of such a sputtering target, In:M:Zn=1:1:1, In:M:Zn=1:1:1.2, In:M:Zn=3:1:2, and In:M:Zn=2:1:3 are preferable. Note that the atomic ratios of metal elements in the oxide semiconductor film formed by a sputtering method vary from those in the sputtering target used, within an error range of ±40%.

For example, when In-Ga-Zn oxide films are formed as the OS layers 661 and 663 by a sputtering method, an In-Ga-Zn oxide target (In:Ga:Zn=1:3:2 [atomic ratio]) can be used for the deposition of the oxide semiconductor films. The deposition conditions can be as follows: an argon gas (flow rate: 30 sccm) and an oxygen gas (flow rate: 15 sccm) are used as the deposition gas; the pressure is 0.4 Pa; the substrate temperature is 200° C.; and the DC power is 0.5 kW.

Figure 10A:
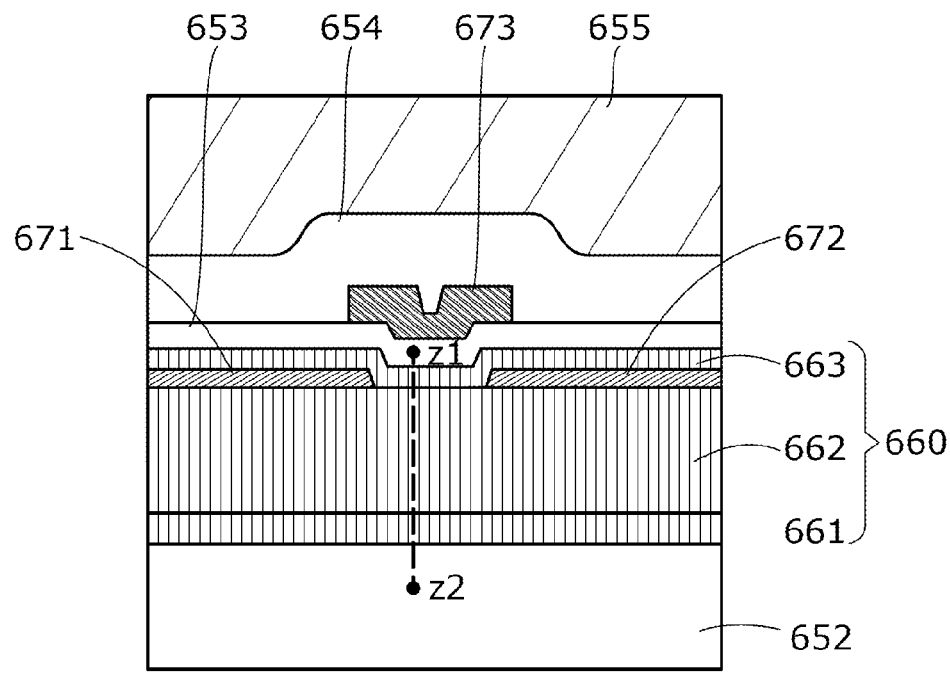
FIGS. 10A and 10B are a partial enlarged view of FIG. 8B and an energy band diagram of an OS transistor, respectively.
Figure 10B:
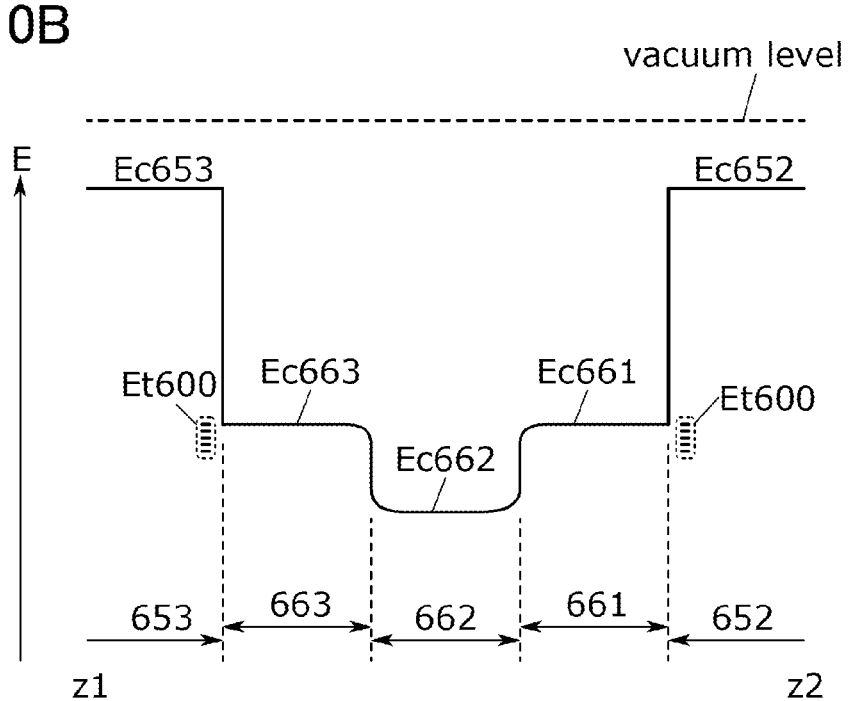

In the case where an In-Ga-Zn oxide film is formed as the OS layer 662 by a sputtering method, a polycrystalline target containing an In-Ga-Zn oxide (In:Ga:Zn=1:1:1 [atomic ratio]) is preferably used for the deposition of the oxide semiconductor film. With such a target, a CAAC-OS film that will be described later can be formed. The conditions of deposition using the target can be as follows, for example: an argon gas (flow rate: 30 sccm) and an oxygen gas (flow rate: 15 sccm) are used as the deposition gas; the pressure is 0.4 Pa; the substrate temperature is 300° C.; and the DC power is 0.5 kW. Alternatively, a polycrystalline In-Ga-Zn oxide (In:Ga:Zn=2:1:3 [atomic ratio]) may be used as a target. Note that the CAAC-OS film is an oxide semiconductor film having a c-axis aligned crystal part, and is described later. An OS transistor whose semiconductor region is formed using a CAAC-OS film can have high reliability such as a small variation in electric characteristics due to irradiation of visible light or ultraviolet light.
Energy Band Diagram Next, a function and an effect of the OS layer 660 in which the OS layers 661 to 663 are stacked will be described with reference to an energy band diagram shown in FIG. 10B. FIG. 10A, which is a partial enlarged view of FIG. 8B, is an enlarged view illustrating a channel of the OS transistor 600. FIG. 10B is an energy band diagram of a portion (channel of the OS transistor 600) along dotted line z1-z2 in FIG. 10A.

In FIG. 10B, Ec652, Ec661, Ec662, Ec663, and Ec653 indicate the conduction band minimums of the insulating layer 652, the OS layer 661, the OS layer 662, the OS layer 663, and the gate insulating layer 653, respectively.

A difference in energy between the vacuum level and the conduction band minimum (the difference is also referred to as electron affinity) corresponds to a value obtained by subtracting an energy gap from a difference in energy between the vacuum level and the valence band maximum (the difference is also referred to as ionization potential). The energy gap can be measured using a spectroscopic ellipsometer (UT-300 manufactured by HORIBA Jobin Yvon SAS). The energy difference between the vacuum level and the valence band maximum can be measured using an ultraviolet photoelectron spectroscopy (UPS) device (VersaProbe manufactured by ULVAC-PHI, Inc.).

An In-Ga-Zn oxide formed using a sputtering target with an atomic ratio of In:Ga:Zn=1:3:2 has, for example, an energy gap of approximately 3.5 eV and an electron affinity of approximately 4.5 eV. An In-Ga-Zn oxide formed using a sputtering target with an atomic ratio of In:Ga:Zn=1:3:4 has an energy gap of approximately 3.4 eV and an electron affinity of approximately 4.5 eV. An In-Ga-Zn oxide formed using a sputtering target with an atomic ratio of In:Ga:Zn=1:3:6 has an energy gap of approximately 3.3 eV and an electron affinity of approximately 4.5 eV. An In-Ga-Zn oxide formed using a sputtering target with an atomic ratio of In:Ga:Zn=1:6:2 has an energy gap of approximately 3.9 eV and an electron affinity of approximately 4.3 eV. An In-Ga-Zn oxide formed using a sputtering target with an atomic ratio of In:Ga:Zn=1:6:8 has an energy gap of approximately 3.5 eV and an electron affinity of approximately 4.4 eV. An In-Ga-Zn oxide which is formed using a sputtering target having an atomic ratio of In:Ga:Zn=1:6:10 has an energy gap of approximately 3.5 eV and an electron affinity of approximately 4.5 eV. An In-Ga-Zn oxide formed using a sputtering target with an atomic ratio of In:Ga:Zn=1:1:1 has an energy gap of approximately 3.2 eV and an electron affinity of approximately 4.7 eV. An In-Ga-Zn oxide formed using a sputtering target with an atomic ratio of In:Ga:Zn=3:1:2 has an energy gap of approximately 2.8 eV and an electron affinity of approximately 5.0 eV.

Since the insulating layer 652 and the gate insulating layer 653 are insulators, Ec652 and Ec653 are closer to the vacuum level than Ec661, Ec662, and Ec663 (i.e., the insulating layer 652 and the gate insulating layer 653 have a smaller electron affinity than the OS layer 661, the OS layer 662, and the OS layer 663).

Ec661 is closer to the vacuum level than Ec662. Specifically, Ec661 is preferably located closer to the vacuum level than Ec662 by 0.05 eV or more, 0.07 eV or more, 0.1 eV or more, or 0.15 eV or more and 2 eV or less, 1 eV or less, 0.5 eV or less, or 0.4 eV or less.

Ec663 is closer to the vacuum level than Ec662. Specifically, Ec663 is preferably located closer to the vacuum level than Ec662 by 0.05 eV or more, 0.07 eV or more, 0.1 eV or more, or 0.15 eV or more and 2 eV or less, 1 eV or less, 0.5 eV or less, or 0.4 eV or less.

Mixed regions are formed in the vicinity of the interface between the OS layer 661 and the OS layer 662 and the interface between the OS layer 662 and the OS layer 663; thus, the energy of the conduction band minimum changes continuously. In other words, no state or few states exist at these interfaces.

Accordingly, electrons transfer mainly through the OS layer 662 in the stacked-layer structure having the above energy band. Therefore, even if an interface state exists between the OS layer 661 and the insulating layer 652 or between the OS layer 663 and the gate insulating layer 653, the interface state hardly influences the transfer of electrons. In addition, since no interface state or few interface states exist between the OS layer 661 and the OS layer 662 and between the OS layer 662 and the OS layer 663, the transfer of electrons is not interrupted in the regions. Consequently, the OS transistor 600 including the above stacked oxide semiconductors can have high field-effect mobility.

Although trap states Et600 due to impurities or defects might be formed in the vicinity of the interface between the OS layer 661 and the insulating layer 652 and the interface between the OS layer 663 and the gate insulating layer 653 as illustrated in FIG. 10B, the OS layer 662 can be separated from the trap states owing to the existence of the OS layer 661 and the OS layer 663.

In the OS transistor 600 described in this embodiment, in the channel width direction, the top surface and side surfaces of the OS layer 662 are in contact with the OS layer 663, and the bottom surface of the OS layer 662 is in contact with the OS layer 661 (see FIG. 8C). Surrounding the OS layer 662 by the OS layer 661 and the OS layer 663 in this manner can further reduce the influence of the trap states.

However, when the energy difference between Ec662 and Ec661 or Ec663 is small, an electron in the OS layer 662 might reach the trap state by passing over the energy difference. Since the electron is trapped at the trap state, a negative fixed charge is generated at the interface with the insulating film, causing the threshold voltage of the transistor to be shifted in the positive direction. Therefore, each of the energy gaps between Ec661 and Ec662 and between Ec662 and Ec663 is preferably 0.1 eV or more, further preferably 0.15 eV or more, in which case a change in the threshold voltage of the transistor can be reduced and the transistor can have favorable electrical characteristics.

The band gap of each of the OS layer 661 and the OS layer 663 is preferably wider than that of the OS layer 662.

For the OS layer 661 and the OS layer 663, a material containing Al, Ti, Ga, Ge, Y, Zr, Sn, La, Ce, or Hf with a higher atomic ratio than that used for the OS layer 662 can be used, for example. Specifically, any of the above metal elements in an atomic ratio 1.5 times or more, preferably 2 times or more, further preferably 3 times or more as much as a metal element of the OS layer 662 is contained. Any of the above metal elements is strongly bonded to oxygen and thus has a function of preventing generation of oxygen vacancy in the oxide semiconductor. That is, an oxygen vacancy is less likely to be generated in the OS layer 661 and the OS layer 663 than in the OS layer 662.

When each of the OS layer 661, the OS layer 662, and the OS layer 663 is an In-M-Zn oxide containing at least indium, zinc, and M (M is a metal such as Al, Ti, Ga, Ge, Y, Zr, Sn, La, Ce, or Hf) and the atomic ratio of In to M and Zn of the OS layer 661 is $x_1:y_1:z_1$, that of the OS layer 662 is $x_2:y_2:z_2$, and that of the OS layer 663 is $x_3:y_3:z_3$, each of $y_1/x_1$ and $y_3/x_3$ is preferably larger than $y_2/x_2$. Each of $y_1/x_1$ and $y_3/x_3$ is one and a half times or more as large as $y_2/x_2$, preferably twice or more as large as $y_2/x_2$, more preferably three times or more as large as $y_2/x_2$. In this case, the transistor can have stable electrical characteristics when $y_2$ is greater than or equal to $x_2$ in the OS layer 662. However, when $y_2$ is 3 times or more as large as $x_2$, the field-effect mobility of the transistor is reduced; accordingly, $y_2$ is preferably smaller than 3 times $x_2$.

In the case where Zn and O are not taken into consideration, the proportion of In and the proportion of M in the OS layer 661 and the OS layer 663 are preferably lower than 50 atomic % and higher than or equal to 50 atomic %, respectively, and further preferably lower than 25 atomic % and higher than or equal to 75 atomic %, respectively. In the case where Zn and O are not taken into consideration, the proportion of In and the proportion of M in the OS layer 662 are preferably greater than or equal to 25 atomic % and less than 75 atomic %, respectively, and further preferably greater than or equal to 34 atomic % and less than 66 atomic %, respectively.

The thickness of each of the OS layer 661 and the OS layer 663 ranges from 3 nm to 100 nm, preferably from 3 nm to 50 nm. The thickness of the OS layer 662 ranges from 3 nm to 200 nm, preferably from 3 nm to 100 nm, further preferably from 3 nm to 50 nm. The OS layer 662 is preferably thicker than the OS layer 661 and the OS layer 663.

Note that stable electrical characteristics can be effectively imparted to an OS transistor in which an oxide semiconductor layer serves as a channel by reducing the concentration of impurities in the oxide semiconductor layer to make the oxide semiconductor layer intrinsic or substantially intrinsic. The term "substantially intrinsic" refers to the state where an oxide semiconductor layer has a carrier density lower than $1\times10^{17}$ /cm$^3$, lower than $1\times10^{15}$ /cm$^3$, or lower than $1\times10^{13}$ /cm$^3$.

In the oxide semiconductor, hydrogen, nitrogen, carbon, silicon, and a metal element other than a main component are impurities. For example, hydrogen and nitrogen form donor levels to increase the carrier density, and silicon forms impurity levels in the oxide semiconductor layer. Silicon in the oxide semiconductor forms an impurity level. The impurity levels serve as traps and might cause the electrical characteristics of the OS transistor to deteriorate. Therefore, it is preferable to reduce the concentration of the impurities in the OS layer 661, the OS layer 662, and the OS layer 663 and at interfaces between the layers.

In order to make the oxide semiconductor intrinsic or substantially intrinsic, the concentration of silicon at a certain depth of the oxide semiconductor or in a region of the oxide semiconductor is preferably lower than $1\times10^{19}$ atoms/cm$^3$, lower than $5\ 10^{18}$ atoms/cm$^3$, or lower than $1\times10^{18}$ atoms/cm$^3$. The concentration of hydrogen at a certain depth of the oxide semiconductor or in a region of the oxide semiconductor is preferably lower than or equal to $2\times10^{20}$ atoms/cm$^3$, lower than or equal to $5\times10^{19}$ atoms/cm$^3$, lower than or equal to $1\times10^{19}$ atoms/cm$^3$, or lower than or equal to $5\times10^{18}$ atoms/cm$^3$. The concentration of nitrogen at a certain depth of the oxide semiconductor or in a region of the oxide semiconductor is preferably lower than $5\times10^{19}$ atoms/cm$^3$, lower than or equal to $5\times10^{18}$ atoms/cm$^3$, lower than or equal to $1\times10^{18}$ atoms/cm$^3$, or lower than or equal to $5\times10^{17}$ atoms/cm$^3$.

In the case where the oxide semiconductor includes a crystal part, high concentration of silicon or carbon might reduce the crystallinity of the oxide semiconductor. In order not to lower the crystallinity of the oxide semiconductor, the concentration of silicon at a certain depth of the oxide semiconductor or in a region of the oxide semiconductor is preferably lower than $1\times10^{19}$ atoms/cm$^3$, lower than $5\times10^{18}$ atoms/cm$^3$, or lower than $1\times10^{18}$ atoms/cm$^3$. Furthermore, the concentration of carbon at a certain depth of the oxide semiconductor or in a region of the oxide semiconductor is preferably lower than $1\times10^{19}$ atoms/cm$^3$, lower than $5\times10^{18}$ atoms/cm$^3$, or lower than $1\times10^{18}$ atoms/cm$^3$.

The listed concentrations of the impurities such as oxygen and carbon are values obtained by secondary ion mass spectrometry (SIMS). With the use of such a highly purified oxide semiconductor, the off-state current of the OS transistor can be reduced. When the voltage between a source and a drain is approximately 0.1 V to 10 V, for example, the off-state current standardized on the channel width can be as low as several yoctoamperes per micrometer to several zeptoamperes per micrometer.

In each of the OS transistors 600 and 601 described as examples in this embodiment, the gate electrode 673 is formed to electrically surround the OS layer 660 in the channel width direction; consequently, a gate electric field is applied to the OS layer 660 in the side surface direction in addition to the perpendicular direction (see FIG. 8C). In other words, a gate electric field is applied to the whole oxide semiconductor layer, so that current flows through the entire OS layer 662 serving as a channel, leading to a further increase in on-state current. The components of the OS transistors 600 and 601 will be described below.

Crystal Structure of Oxide Semiconductor

First, a structure of an oxide semiconductor that forms the OS layer 660 will be described. In this specification, trigonal and rhombohedral crystal systems are included in a hexagonal crystal system.

Oxide semiconductors are classified roughly into a single-crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a microcrystalline oxide semiconductor, a nanocrystalline oxide semiconductor (nc-OS), an amorphous-like oxide semiconductor (a-like OS), and an amorphous oxide semiconductor.

It is known that an amorphous structure is generally defined as being metastable and unfixed, and being isotropic and having no non-uniform structure. In other words, an amorphous structure has a flexible bond angle and a short-range order but does not have a long-range order.

This means that an inherently stable oxide semiconductor cannot be regarded as a completely amorphous oxide semiconductor. Moreover, an oxide semiconductor that is not isotropic (e.g., an oxide semiconductor film that has a periodic structure in a microscopic region) cannot be regarded as a completely amorphous oxide semiconductor. Note that an a-like OS has a periodic structure in a microscopic region, but at the same time has a void and has an unstable structure. For this reason, an a-like OS has physical properties similar to those of an amorphous oxide semiconductor.

CAAC-OS

A CAAC-OS is one of oxide semiconductors having a plurality of c-axis aligned crystal parts (also referred to as pellets). In a combined analysis image (also referred to as a high-resolution TEM image) of a bright-field image and a diffraction pattern of a CAAC-OS, which is obtained using a transmission electron microscope (TEM), a plurality of crystal parts can be observed. However, in the high-resolution TEM image, a boundary between crystal parts, that is, a grain boundary is not clearly observed. Thus, in the CAAC-OS, a reduction in electron mobility due to the grain boundary is less likely to occur.

When the high-resolution TEM image of the CAAC-OS is observed in a direction parallel to a sample surface, metal atoms are arranged in a layered manner in a crystal part. Each metal atom layer has a morphology reflecting the unevenness of a surface over which a CAAC-OS film is formed (hereinafter the surface is referred to as a formation surface) or a top surface of the CAAC-OS, and is arranged parallel to the formation surface or the top surface of the CAAC-OS.

In this specification, the term "parallel" indicates that the angle formed between two straight lines is greater than or equal to −10° and less than or equal to 10°, and accordingly also includes the case where the angle is greater than or equal to −5° and less than or equal to 5°. The term "perpendicular" indicates that the angle formed between two straight lines is greater than or equal to 80° and less than or equal to 100°, and accordingly includes the case where the angle is greater than or equal to 85° and less than or equal to 95°.

The high-resolution cross-sectional TEM image of the CAAC-OS revealed that the size of one crystal part of the CAAC-OS is 1 nm or greater or 3 nm or greater, and the size of a space caused by tilt of crystal parts is approximately 0.8 nm. Therefore, the crystal part can also be referred to as a nanocrystal (nc). Furthermore, the CAAC-OS can also be referred to as an oxide semiconductor including c-axis aligned nanocrystals (CANC).

In the high-resolution planar TEM image of the CAAC-OS observed in a direction substantially perpendicular to the sample surface, metal atoms arranged in a triangular or hexagonal configuration are seen in the crystal parts. However, there is no regularity of arrangement of metal atoms between different crystal parts.

A CAAC-OS is subjected to structural analysis with an X-ray diffraction (XRD) apparatus. When the CAAC-OS including an InGaZnO$_4$ crystal is analyzed by an out-ofplane method, for example, a peak appears frequently when the diffraction angle (2θ) is around 31°. This peak is derived from the (009) plane of the InGaZnO$_4$ crystal, which indicates that crystals in the CAAC-OS have c-axis alignment, and that the c-axes are aligned in a direction substantially perpendicular to the formation surface or the top surface of the CAAC-OS.

Note that when the CAAC-OS with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS. It is preferable that in the CAAC-OS, a peak of 2θ appear at around 31° and a peak of 2θ not appear at around 36°.

The CAAC-OS is an oxide semiconductor film having low impurity concentration. The impurity is an element other than the main components of the oxide semiconductor, such as hydrogen, carbon, silicon, or a transition metal element. In particular, an element that has higher bonding strength to oxygen than a metal element included in the oxide semiconductor, such as silicon, disturbs the atomic arrangement of the oxide semiconductor by depriving the oxide semiconductor of oxygen and causes a decrease in crystallinity. Furthermore, a heavy metal such as iron or nickel, argon, carbon dioxide, or the like has a large atomic radius (or molecular radius), and thus disturbs the atomic arrangement of the oxide semiconductor film and causes a decrease in crystallinity when it is contained in the oxide semiconductor film. Note that the impurity contained in the oxide semiconductor might serve as a carrier trap or a carrier generation source.

The CAAC-OS is an oxide semiconductor film having a low density of defect states. In some cases, oxygen vacancies in the oxide semiconductor serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor has few carrier generation sources, and thus can have a low carrier density. Thus, a transistor including the oxide semiconductor rarely has negative threshold voltage (is rarely normally on). The highly purified intrinsic or substantially highly purified intrinsic oxide semiconductor has few carrier traps. Accordingly, the transistor including the oxide semiconductor has little variation in electrical characteristics and high reliability. Electric charge trapped by the carrier traps in the oxide semiconductor takes a long time to be released, and might behave like fixed electric charge. Thus, the transistor which includes the oxide semiconductor having high impurity concentration and a high density of defect states has unstable electrical characteristics in some cases.

Microcrystalline Oxide Semiconductor, nc-OS

An nc-OS has a region in which a crystal part is observed and a region in which a crystal part is not clearly observed in a high-resolution TEM image. In most cases, the size of a crystal part included in the nc-OS is greater than or equal to 1 nm and less than or equal to 10 nm, or greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different crystal parts in the nc-OS. Thus, the orientation of the whole film is not observed. Accordingly, in some cases, the nc-OS cannot be distinguished from an a-like OS or an amorphous oxide semiconductor depending on an analysis method. For example, when the nc-OS is analyzed by an out-of-plane method with an XRD apparatus using an X-ray beam having a diameter larger than the size of a crystal part, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a crystal part. Meanwhile, spots appear in a nanobeam electron diffraction pattern of the nc-OS when an electron beam having a probe diameter close to or smaller than the size of a crystal part is applied. Moreover, in a nanobeam electron diffraction pattern of the nc-OS, regions with high luminance in a circular (ring) pattern are shown in some cases. Also in a nanobeam electron diffraction pattern of the nc-OS, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an amorphous oxide semiconductor. Note that there is no regularity of crystal orientation between different crystal parts in the nc-OS. Therefore, the nc-OS has a higher density of defect states than the CAAC-OS.

Amorphous Oxide Semiconductor

The amorphous oxide semiconductor has disordered atomic arrangement and no crystal part. For example, the amorphous oxide semiconductor does not have a specific state as in quartz.

In the high-resolution TEM image of the amorphous oxide semiconductor, crystal parts cannot be found. When the amorphous oxide semiconductor is subjected to structural analysis by an out-of-plane method with an XRD apparatus, a peak showing a crystal plane does not appear. A halo pattern is shown in an electron diffraction pattern of the amorphous oxide semiconductor. Furthermore, a halo pattern is shown but a spot is not shown in a nanobeam electron diffraction pattern of the amorphous oxide semiconductor.

a-like OS

An a-like OS has a structure intermediate between those of the nc-OS and the amorphous oxide semiconductor. In a high-resolution TEM image of the a-like OS, a void may be observed. Furthermore, in the high-resolution TEM image, there are a region where a crystal part is clearly observed and a region where a crystal part is not observed. The a-like OS has an unstable structure because it contains a void. In the a-like OS, crystallization by a slight amount of electron beam used for TEM observation occurs and growth of the crystal part is found sometimes. In contrast, crystallization by a slight amount of electron beam used for TEM observation is less observed in the nc-OS having good quality.

Note that the crystal part size in the a-like OS and the nc-OS can be measured using high-resolution TEM images. For example, an InGaZnO4 crystal has a layered structure in which two Ga-Zn-O layers are included between In-O layers. A unit cell of the InGaZnO4 crystal has a structure in which nine layers of three In-O layers and six Ga-Zn-O layers are layered in the c-axis direction. Thus, the distance between the adjacent layers is equivalent to the lattice spacing on the (009) plane (also referred to as d value). The value is calculated to be 0.29 nm from crystal structural analysis. Thus, each of the lattice fringes having a distance therebetween of from 0.28 nm to 0.30 nm corresponds to the a-b plane of the InGaZnO$_4$ crystal, focusing on the lattice fringes in the high-resolution TEM image.

An oxide semiconductor may be a stack including two or more of an amorphous oxide semiconductor, an a-like OS, a microcrystalline oxide semiconductor, and a CAAC-OS, for example.

Substrate

The substrate 640 is not limited to a simple supporting substrate and may be a substrate where a device such as a transistor is formed. In that case, one of the gate electrode 673, the electrode 671, and the electrode 672 of the OS transistor 600 may be electrically connected to the device.

Base Insulating Film

The insulating layer 652 can have a function of supplying oxygen to the OS layer 660 as well as a function of preventing diffusion of impurities from the substrate 640. For this reason, the insulating layer 652 is preferably an insulating film containing oxygen and more preferably an insulating film having an oxygen content higher than that in the stoichiometric composition. For example, the insulating layer is a film of which the amount of released oxygen when converted into oxygen atoms is $1.0 \times 10^{19}$ atoms/cm$^3$ or more in thermal desorption spectroscopy (TDS) analysis. Here, the TDS analysis is conducted at a film surface temperature of higher than or equal to 100° C. and lower than or equal to 700° C. When the substrate 640 is a substrate where a device is formed as described above, the insulating layer 652 is preferably subjected to planarization treatment such as chemical mechanical polishing (CMP) treatment so as to have a flat surface.

The insulating layer 652 can be formed using an oxide insulating film of aluminum oxide, aluminum oxynitride, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like, a nitride insulating film of silicon nitride, silicon nitride oxide, aluminum nitride oxide, or the like, or a film in which any of the above materials are mixed.

Gate Electrode

The gate electrode 673 can be formed using, for example, a metal element selected from chromium (Cr), copper (Cu), aluminum (Al), gold (Au), silver (Ag), zinc (Zn), molybdenum (Mo), tantalum (Ta), titanium (Ti), tungsten (W), manganese (Mn), nickel (Ni), iron (Fe), cobalt (Co), and ruthenium (Ru); or an alloy or a conductive compound containing one or more of the metal elements. Examples of the conductive compound are titanium nitride and nickel silicide.

The gate electrode 673 may have a single-layer structure or a stacked-layer structure of two or more layers. For example, any of the following structures can be employed: a single-layer structure of an aluminum film containing silicon; a two-layer structure in which a titanium film is stacked over an aluminum film; a two-layer structure in which a titanium film is stacked over a titanium nitride film; a two-layer structure in which a tungsten film is stacked over a titanium nitride film; a two-layer structure in which a tungsten film is stacked over a tantalum nitride film or a tungsten nitride film; a three-layer structure in which a titanium film, an aluminum film, and a titanium film are stacked in this order; a single-layer structure of a Cu-Mn alloy film; a two-layer structure in which a Cu film is stacked over a Cu-Mn alloy film; and a three-layer structure in which a Cu-Mn alloy film, a Cu film, and a Cu-Mn alloy film are stacked in this order. A Cu-Mn alloy film is preferably used because of its low electrical resistance and because it forms manganese oxide at the interface with an insulating film containing oxygen and manganese oxide can prevent Cu diffusion.

A conductive film included in the gate electrode 673 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. The gate electrode 673 may be formed of a stack formed using any of the above light-transmitting conductive materials and any of the above metal elements, for example.

Gate Insulating Layer

The gate insulating layer 653 is formed using an insulating film having a single-layer structure or a stacked-layer structure. The insulating film may be formed using an insulating material such as aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide. The gate insulating layer 653 may contain lanthanum (La), nitrogen, or zirconium (Zr) as an impurity. The insulating layer 651 can be formed in a manner similar to that for the gate insulating layer 653.

The gate insulating layer 653 can be formed using, for example, a stack including a hafnium oxide film and a silicon oxide film or a stack including a hafnium oxide film and a silicon oxynitride film. Hafnium oxide has a higher dielectric constant than silicon oxide and silicon oxynitride. Therefore, the thickness can be made large as compared with silicon oxide; as a result, leakage current due to tunnel current can be low. That is, it is possible to provide a transistor with a low off-state current. Moreover, hafnium oxide with a crystalline structure has higher dielectric constant than hafnium oxide with an amorphous structure. Thus, to reduce off-state current of the OS transistor, the gate insulating layer 653 preferably contains hafnium oxide having a crystal structure. Examples of the crystalline structure include a monoclinic crystal structure and a cubic crystal structure. Note that one embodiment of the present invention is not limited to the above examples.

Source Electrode, Drain Electrode, Second Gate Electrode

The electrodes 671 and 672 and the conductive layer 674 can be formed in a manner similar to that of the gate electrode 673. A Cu-Mn alloy film is preferably used for the electrodes 671 and 672 because it forms manganese oxide at the interface with the OS layer 660 and manganese oxide can prevent Cu diffusion.

Protective Insulating Film

The insulating layer 654 has a function of blocking oxygen, hydrogen, water, alkali metal, alkaline earth metal, and the like. Providing the insulating layer 654 can prevent outward diffusion of oxygen from the OS layer 660 and entry of hydrogen, water, or the like into the OS layer 660 from the outside. The insulating layer 654 can be, for example, a nitride insulating film. Examples of the nitride insulating film include a silicon nitride film, a silicon nitride oxide film, an aluminum nitride film, and an aluminum nitride oxide film. Note that instead of the nitride insulating film having a blocking effect against oxygen, hydrogen, water, alkali metal, alkaline earth metal, and the like, an oxide insulating film having a blocking effect against oxygen, hydrogen, water, and the like, may be provided. As the oxide insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given.

An aluminum oxide film is preferably used as the insulating layer 654 because it is highly effective in preventing transmission of both oxygen and impurities such as hydrogen and moisture. Thus, during and after the manufacturing process of the transistor, the aluminum oxide film can suitably serve as a protective film that has effects of preventing entry of impurities such as hydrogen and moisture, which cause variations in the electrical characteristics of the transistor, into the OS layer 660, preventing release of oxygen, which is the main component of the OS layer 660, from the oxide semiconductor, and preventing unnecessary release of oxygen from the insulating layer 652. In addition, oxygen contained in the aluminum oxide film can be diffused into the oxide semiconductor.

Interlayer Insulating Film

The insulating layer 655 is preferably formed over the insulating layer 654. The insulating layer 655 can be formed using an insulating film with a single-layer structure or a layered structure. The insulating film can be formed using, for example, a film containing aluminum oxide, aluminum oxynitride, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, or the like.

Film Formation Method

A sputtering method and a plasma CVD method are typical examples of a method of forming an insulating film, a conductive film, a semiconductor film, and the like. The insulating film, the conductive film, the semiconductor film, and the like may be formed by another method, for example, a thermal CVD method. A metal organic chemical vapor deposition (MOCVD) method or an atomic layer deposition (ALD) method can be employed as a thermal CVD method, for example.

Since plasma is not used for deposition, a thermal CVD method has an advantage that no defect due to plasma damage is generated. Deposition by a thermal CVD method may be performed in such a manner that a source gas and an oxidizer are supplied to a chamber at a time, the pressure in the chamber is set to an atmospheric pressure or a reduced pressure, and reaction is caused in the vicinity of or over a substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). In such a case, a first source gas is introduced, an inert gas (e.g., argon or nitrogen) or the like is introduced at the same time as or after the first source gas, and then a second source gas is introduced, whereby the source gases are not mixed. Note that in the case where the first source gas and the inert gas are introduced at a time, the inert gas serves as a carrier gas. The inert gas may also be introduced at the same time as the second source gas. Alternatively, the first source gas may be exhausted by vacuum evacuation instead of the introduction of the inert gas, and then the second source gas may be introduced. The first source gas is adsorbed on a surface of the substrate to form a first single-atomic layer and then, the second source gas is introduced to react with the first single-atomic layer; as a result, a second single-atomic layer is stacked over the first single-atomic layer, so that a thin film is formed. The sequence of the gas introduction is repeated plural times until a desired thickness is obtained, whereby a thin film with excellent step coverage can be formed. The thickness of the thin film can be adjusted by the number of repetition times of the sequence of the gas introduction. For this reason, an ALD method makes it possible to accurately adjust a thickness and thus is suitable for manufacturing a minute FET.

The conductive film and the semiconductor film that are described in the above embodiment can be formed by a thermal CVD method such as a MOCVD method or an ALD method. For example, in the case where an InGaZnOx (X>0) film is formed, trimethylindium, trimethylgallium, and diethylzinc are used. Note that the chemical formula of trimethylindium is $(CH_3)_3In$. The chemical formula of diethylzinc is $(C_2H_5)_2Zn$. Without limitation to the above combination, triethylgallium (chemical formula: $(C_2H_5)_3Ga$) can be used instead of trimethylgallium and dimethylzinc (chemical formula: $(CH_3)_2Zn$) can be used instead of diethylzinc.

In the case where a tungsten film is formed using a deposition apparatus employing ALD, for example, a $WF_6$ gas and a $B_2H_6$ gas are sequentially introduced plural times to form an initial tungsten film, and then a $WF_6$ gas and an $H_2$ gas are introduced at a time, so that the tungsten film is formed. Note that an $SiH_4$ gas may be used instead of a $B_2H_6$ gas.

In the case where an oxide semiconductor film, e.g., an InGaZnOx (X>0) film is formed using a deposition apparatus employing ALD, for example, an $(CH_3)_3In$ gas and an $O_3$ gas are sequentially introduced plural times to form an $InO_2$ layer, a $Ga(CH_3)_3$ gas and an $O_3$ gas are introduced at a time to form a GaO layer, and then a $Zn(CH_3)_2$ gas and an $O_3$ gas are introduced at a time to form a ZnO layer. Note that the order of these layers is not limited to this example. A mixed compound layer such as an $InGaO_2$ layer, an $InZnO_2$ layer, a GaInO layer, a ZnInO layer, or a GaZnO layer may be formed by mixing of these gases. Although an $H_2O$ gas which is obtained by bubbling with an inert gas such as an Ar gas may be used instead of an $O_3$ gas, it is preferable to use an $O_3$ gas, which does not contain H. Instead of an $(CH_3)_3In$ gas, an $In(C_2H_5)_3$ gas may be used. Instead of a $Ga(CH_3)_3$ gas, a $(C_2H_5)_3Ga$ gas may be used. Furthermore, a $(CH_3)_2Zn$ gas may be used.

Embodiment 3

Figure 11:
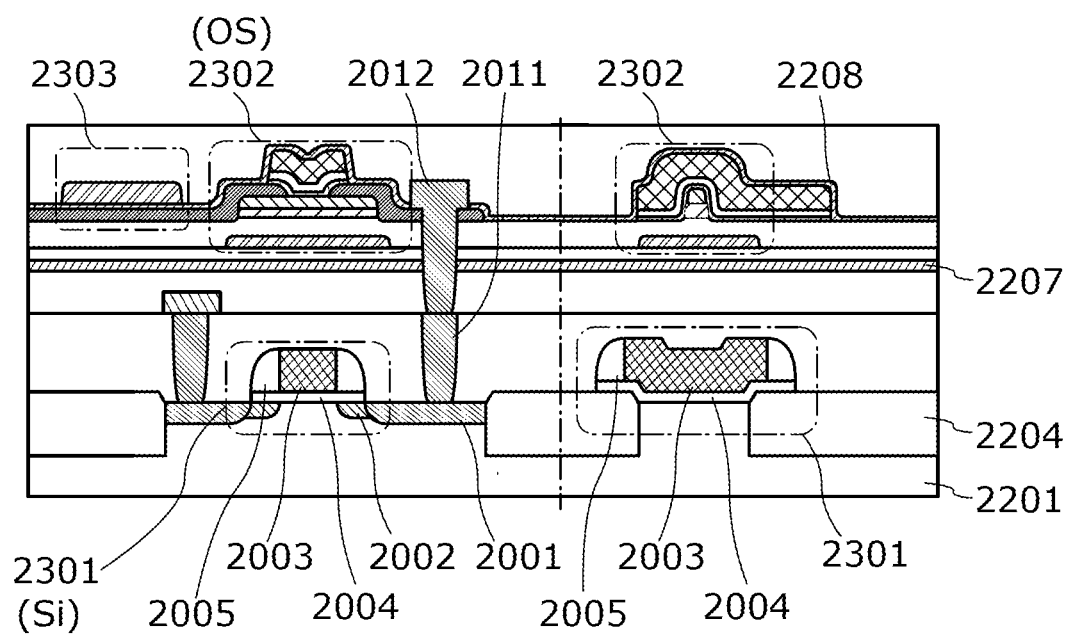
FIG. 11 is a cross-sectional view illustrating a structure example of a semiconductor device.

A structure of the semiconductor device of Embodiment 1 is described. FIG. 11 is a cross-sectional view illustrating a structure example of a semiconductor device. In the semiconductor device illustrated in FIG. 11, a circuit block including an OS transistor and a capacitor is stacked over a circuit block including a Si transistor. FIG. 11 is a schematic cross-sectional view of an IC chip die of a semiconductor device. Note that FIG. 11 is not a diagram of the IC chip die taken along a specific line but a diagram for illustrating a stacked-layer structure of the IC chip die.

The semiconductor device illustrated in FIG. 11 includes a substrate 2201, a transistor 2301, a transistor 2302, and a capacitor 2303. The left side of FIG. 11 illustrates a cross section in a channel length direction of the transistors 2301 and 2302, and the right side of FIG. 11 illustrates a cross section in a channel width direction. It is needless to say that the channel length direction of the transistor 2301 does not necessarily agree with that of the transistor 2302 in an actual semiconductor device.

The transistors 2301 and 2302 are electrically connected to each other through a plug 2011 and a plug 2012. The transistor 2302 and the capacitor 2303 are electrically connected to each other because one electrode of the transistor 2302 and one electrode of the capacitor 2303 are formed using the same conductive film.

In FIG. 11, regions without reference numerals and hatch patterns represent regions formed of an insulator. The regions can be formed using an insulator containing at least one of aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like. Alternatively, for the regions, an organic resin such as a polyimide resin, a polyamide resin, an acrylic resin, a siloxane resin, an epoxy resin, or a phenol resin can be used.

The transistor 2301, a Si transistor here, has a semiconductor region containing a Group 14 element. The transistor 2302 is an OS transistor. In the case where the semiconductor device illustrated in FIG. 11 includes the semiconductor device 101 (FIG. 2), for example, the transistor 2301 is included in the circuit 11 and the transistor 2302 and the capacitor 2303 are included in the circuit RC2. Specifically, the transistor 2301 is included in an analog switch electrically connected to the terminal a20 of the circuit SELC1. The transistor 2302 and the capacitor 2303 correspond to any of the switches SW1, SW2, and SW3 in the circuit RC1 and the capacitor CP1, respectively.

The Si transistor and the OS transistor are stacked as illustrated in FIG. 11, whereby circuits can be three-dimensionally integrated over the semiconductor substrate. For this reason, area overhead can be zero even when a circuit including an OS transistor is added to the semiconductor device.

In the example in FIG. 11, the OS transistor 2302 and the capacitor 2303 are formed in the same element tier. However, the capacitor 2303 can be stacked over the OS transistor 2302, for example, in which case the electrostatic capacitance of the capacitor 2303 can be increased without increasing the circuit area.

As the substrate 2201, a single crystal semiconductor substrate, a polycrystalline semiconductor substrate, a silicon on insulator (SOI) substrate, or the like made of silicon, silicon carbide, silicon germanium, or the like can be used. A transistor formed using a semiconductor substrate can easily operate at high speed. In the case of using a p-type single crystal silicon substrate as the substrate 2201, an impurity element imparting n-type conductivity may be added to part of the substrate 2201 to form an n-well, and a p-type transistor can be formed in a region where the n-well is formed. As the impurity element imparting n-type conductivity, phosphorus (P), arsenic (As), or the like can be used. As the impurity element imparting p-type conductivity, boron (B) or the like may be used.

Alternatively, the substrate 2201 can be a conductor substrate or an insulating substrate provided with a semiconductor film. Examples of the conductor substrate include a metal substrate, a stainless steel substrate, a substrate including stainless steel foil, a tungsten substrate, and a substrate including tungsten foil. Examples of the insulating substrate include a glass substrate, a quartz substrate, a plastic substrate, a flexible substrate, an attachment film, paper including a fibrous material, and a base film. Examples of the glass substrate are a barium borosilicate glass substrate, an aluminoborosilicate glass substrate, and a soda lime glass substrate. Examples of the flexible substrate are flexible synthetic resin substrates such as substrates of plastics typified by polyethylene terephthalate (PET), polyethylene naphthalate (PEN), and polyether sulfone (PES) and an acrylic substrate. Examples of the attachment film are attachment films formed using polypropylene, polyester, polyvinyl fluoride, polyvinyl chloride, and the like. Examples of the base film are base films formed using polyester, polyamide, polyimide, aramid, epoxy, an inorganic vapor deposition film, and paper.

Here, a single crystal silicon substrate is used as the substrate 2201. Thus, the transistor 2301 is a Si transistor whose semiconductor region contains single crystal silicon. Hereinafter, the transistor 2301 is sometimes referred to as the Si transistor 2301 and the transistor 2302 is sometimes referred to as the OS transistor 2302.

In FIG. 11, the reference numeral 2204 indicates an element isolation layer.

The Si transistor 2301 includes an impurity region 2001, an impurity region 2002, a gate electrode 2003, a gate insulating film 2004, and a sidewall insulating layer 2005. The impurity region 2001 serves as a source region or a drain region. The impurity region 2002 serves as a lightly doped drain (LDD) region or an extension region.

Although the Si transistor 2301 is a planar type transistor in the example illustrated in FIG. 11, the Si transistor 2301 can be any of a variety of types of transistors instead of a planar type transistor. For example, a transistor whose semiconductor region has a three-dimensional structure, such as a FIN-type transistor or a tri-gate transistor can be used. The OS transistor 2302 in the example in FIG. 11 includes a back gate; however, a structure without a back gate may be employed.

Hydrogen in an insulating film provided in the vicinity of the semiconductor region of the Si transistor 2301 terminates dangling bonds of silicon; accordingly, the reliability of the Si transistor 2301 can be improved. On the other hand, hydrogen in the insulating film is a factor of generating carriers in an oxide semiconductor of an oxide semiconductor layer of the OS transistor 2302 provided in an upper tier. Thus, in the case where the OS transistor 2302 is stacked over the Si transistor 2301 as illustrated in FIG. 11, it is particularly effective that an insulating film 2207 having a function of preventing hydrogen diffusion is provided between the transistors 2301 and 2302. The insulating film 2207 can trap hydrogen in a lower tier (on the substrate 2201 side), which improves the reliability of both the Si transistor 2301 and the OS transistor 2302.

The insulating film 2207 can be formed using, for example, a film containing aluminum oxide, aluminum oxynitride, gallium oxide, gallium oxynitride, yttrium oxide, yttrium oxynitride, hafnium oxide, hafnium oxynitride, yttria-stabilized zirconia (YSZ), or the like, so as to serve as a film for preventing hydrogen diffusion.

It is preferable that an insulating film 2208 that covers the OS transistor 2302 be also formed using an insulating film having a function of preventing hydrogen diffusion like the insulating film 2207. It is particularly preferable that an aluminum oxide film be used as the insulating film 2208. The aluminum oxide film has a high shielding (blocking) effect of preventing penetration of both oxygen and impurities such as hydrogen and moisture. Thus, when the OS transistor 2302 is covered with the aluminum oxide film, release of oxygen from the oxide semiconductor layer of the OS transistor 2302 and entry of water and hydrogen into the oxide semiconductor layer can be prevented. In the example in FIG. 11, the insulating film 2208 also serves as a dielectric of the capacitor 2303.

Embodiment 4

A sequential circuit such as a flip-flop circuit are used for integrated circuits of electronic devices in a wide variety of fields, such as digital signal processing, software-defined radio systems, avionic systems (electronic devices used in aircraft, such as communication systems, navigation systems, autopilot systems, and flight management systems), ASIC prototyping, medical image processing, voice recognition, encryption, bioinformatics, emulators for mechanical systems, ICs for controlling and/or protecting batteries (second batteries), and radio telescopes in radio astronomy. In addition, the holding circuit described in Embodiment 1 can be used in a memory device that backs up the state (data) of the sequential circuit. Thus, the semiconductor device described in Embodiment 1 or the like can be incorporated in a variety of semiconductor devices. In this embodiment, a processing unit for processing data will be described as an example of such a semiconductor device.

CPU

Figure 12:
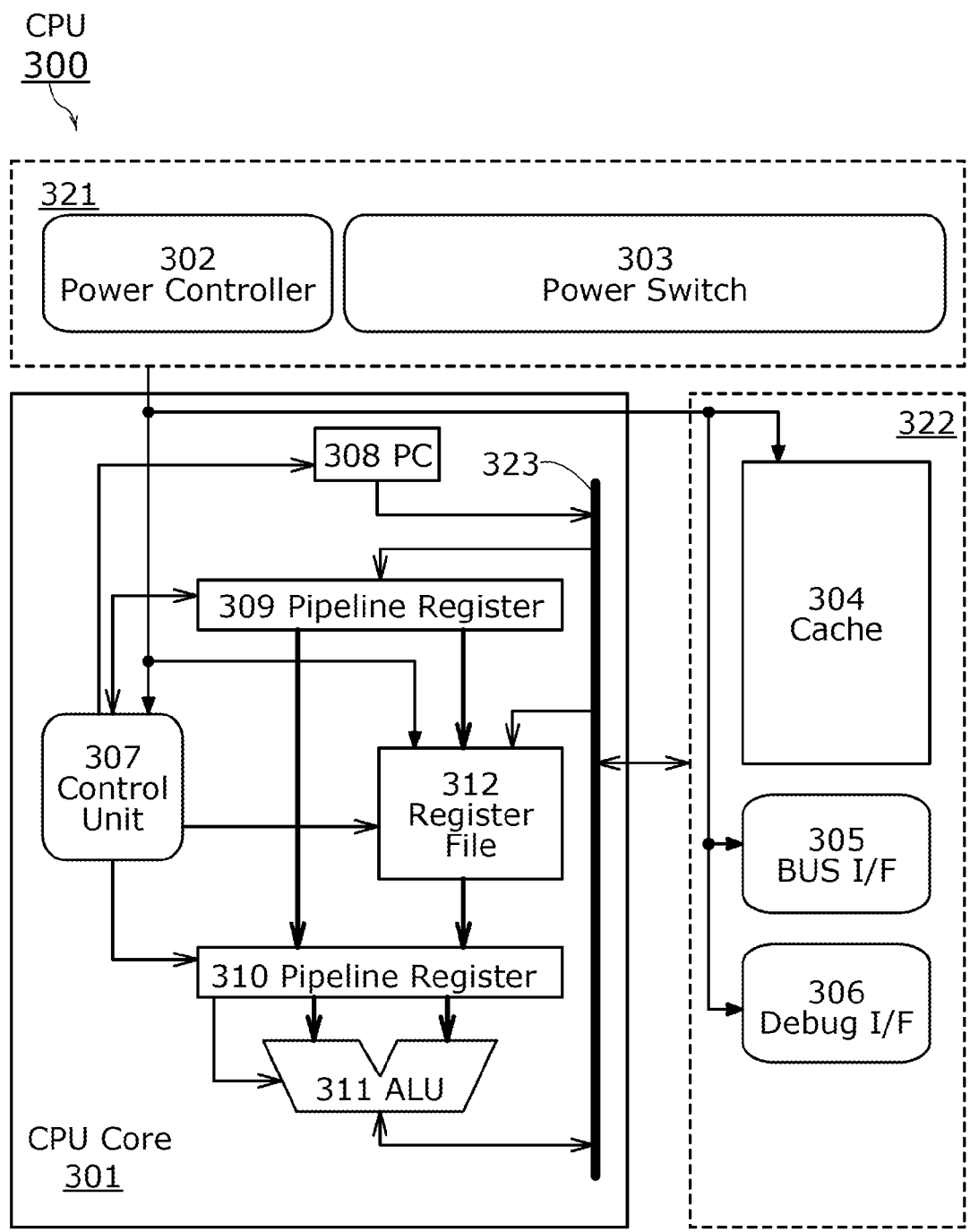
FIG. 12 is a block diagram illustrating an example of a processing unit (CPU).

FIG. 12 illustrates a CPU configuration example. A CPU 300 illustrated in FIG. 12 includes a CPU core 301, a power management unit 321, and a peripheral circuit 322. The power management unit 321 includes a power controller 302 and a power switch 303. The peripheral circuit 322 includes a cache 304 including cache memory, a bus interface (BUS I/F) 305, and a debug interface (Debug I/F) 306. The CPU core 301 includes a data bus 323, a control unit 307, a program counter (PC) 308, a pipeline register 309, a pipeline register 310, an arithmetic logic unit (ALU) 311, and a register file 312. Data is transmitted between the CPU core 301 and the peripheral circuit 322 such as the cache 304 via the data bus 323.

The control unit 307 has functions of decoding and executing instructions contained in a program such as inputted applications by controlling the overall operations of the PC 308, the pipeline registers 309 and 310, the ALU 311, the register file 312, the cache 304, the bus interface 305, the debug interface 306, and the power controller 302.

The ALU 311 has a function of performing a variety of arithmetic operations such as four arithmetic operations and logic operations. The cache 304 has a function of temporarily storing frequently used data. The PC 308 is a register having a function of storing an address of an instruction to be executed next. Although not illustrated in FIG. 12, the cache 304 includes a cache controller for controlling the operation of the cache memory.

The pipeline register 309 has a function of temporarily storing instruction data. The register file 312 includes a plurality of registers including a general purpose register and can store data that is read from the main memory, data obtained as a result of arithmetic operations in the ALU 311, or the like. The pipeline register 310 has a function of temporarily storing data used for arithmetic operations performed in the ALU 311, data obtained as a result of arithmetic operations in the ALU 311, or the like.

The bus interface 305 serves as a path for data between the CPU 300 and devices outside the CPU 300. The debug interface 306 serves as a path of a signal for inputting an instruction to control debugging to the CPU 300.

The power switch 303 has a function of controlling supply of the power supply potential to circuits other than the power controller 302 in the CPU 300. These circuits belong to several different power domains. The power switch 303 controls whether the power supply potential is supplied to circuits in the same power domain. The power controller 302 has a function of controlling the operation of the power switch 303. The CPU 300 with such a configuration can use power gating. An example of a power gating control will be described.

First, the CPU core 301 sets the timing for stopping the supply of the power supply potential in a register of the power controller 302. Next, an instruction to start power gating is sent from the CPU core 301 to the power controller 302. Then, the registers and the cache 304 in the CPU 300 start data storing. Subsequently, the power switch 303 stops the supply of the power supply potential to the circuits other than the power controller 302 in the CPU 300. Then, an interrupt signal is input to the power controller 302, thereby starting the supply of the power supply potential to the circuits included in the CPU 300. Note that a counter may be provided in the power controller 302 to be used to determine the timing of starting the supply of the power supply potential regardless of input of an interrupt signal. Next, the registers and the cache 304 start data restoration. After that, execution of an instruction is resumed in the control unit 307.

This power gating can be used in the entire processing unit or one or more logic circuits included in the processing unit. The semiconductor device of Embodiment 1 or the like achieves power gating at a fine granularity in space or time, leading to a reduction in power consumption of the entire processing unit.

Although a CPU is described here as the processing unit, the semiconductor device of one embodiment of the present invention can be applied to a variety of processing units. For example, the semiconductor device is applicable to an RFID tag, a graphics processing unit (GPU), a programmable logic device (PLD), a digital signal processor (DSP), a microcontroller unit (MCU), a custom LSI, and the like.

Embodiment 5

In this embodiment, an electronic component and electronic devices and the like including the electronic component will be described as examples of a semiconductor device.

Example of Manufacturing Method of Electronic Component

Figure 13A:
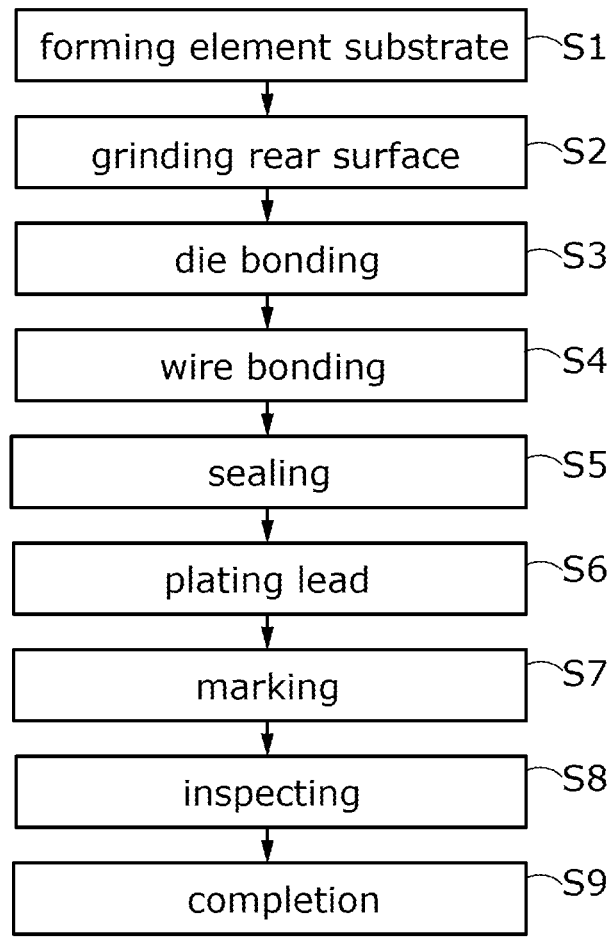
FIGS. 13A and 13B are a flow chart showing an example of a method for manufacturing an electronic component and a diagram illustrating a structure example of an electronic component, respectively.

FIG. 13A is a flow chart showing an example of a method for manufacturing an electronic component. The electronic component is also referred to as a semiconductor package or an IC package. This electronic component has a plurality of standards and names depending on a terminal extraction direction and a terminal shape. Thus, examples of the electronic component are described in this embodiment.

A semiconductor device including a transistor can be completed after an assembly process (post-process) by using a plurality of components that can be detached and attached from and to a printed wiring board in combination. The post-process can be finished through each step in FIG. 13A. Specifically, after an element substrate obtained in the preceding process is completed (Step S1), a rear surface of the substrate is ground (Step S2). By thinning the substrate at this stage, the warpage or the like of the substrate in the preceding process is reduced and the component is downsized.

The rear surface of the substrate is ground so that the substrate is divided into a plurality of chips in a dicing process. Then, the divided chips are separately picked up to be mounted on and bonded to a lead frame in a die bonding process (Step S3). In this die bonding process, the chip is bonded to the lead frame by an appropriate method depending on a product, for example, bonding with a resin or a tape. Note that in the die bonding process, the chip may be mounted on an interposer to be bonded.

Then, wire bonding is performed to electrically connect lead of the lead frame to an electrode on the chip with a metal fine line (wire) (Step S4). A silver line or a gold line can be used as the metal fine line. Ball bonding or wedge bonding can be used as the wire bonding.

A molding process is performed to seal the wire bonded chip with an epoxy resin or the like (Step S5). With the molding process, the electronic component is filled with the resin, so that damage to a mounted circuit portion or wire due to mechanical external force can be reduced. Furthermore, deterioration in characteristics due to moisture or dust can be reduced.

Next, plate processing is performed on the lead of the lead frame. After that, the lead is cut and processed (Step S6). This plate processing prevents rust of the lead and facilitates soldering at the time of mounting the chip on a printed wiring board in a later step.

Next, printing (marking) is performed on a surface of the package (Step S7). Through the final inspection process (Step S8), the electronic component is completed (Step S9).

The above electronic component can include the semiconductor device described in the above embodiment. Thus, the electronic component can consume less power and have smaller size.

Figure 13B:
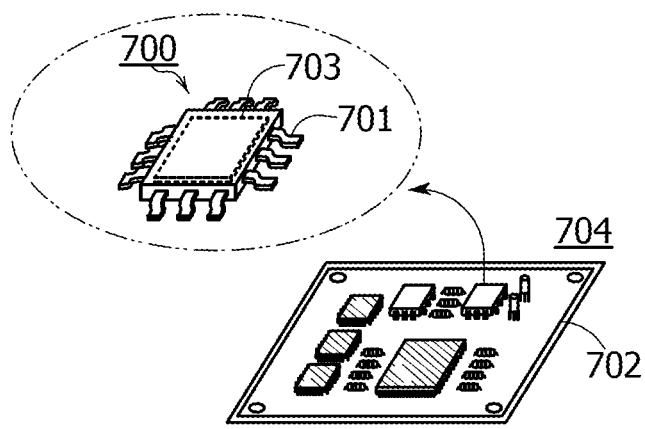

FIG. 13B is a schematic perspective view of the completed electronic component. FIG. 13B illustrates a schematic perspective view of a quad flat package (QFP) as an example of the electronic component. As illustrated in FIG. 13B, an electronic component 700 includes a lead 701 and a circuit portion 703. The electronic component 700 is mounted on a printed wiring board 702, for example. When a plurality of electronic components 700 are used in combination and electrically connected to each other over the printed wiring board 702, the electronic components 700 can be mounted on an electronic device. A completed circuit board 704 is provided in the electronic device or the like. The electronic component 700 can be used as, for example, a random access memory that stores data or a processing unit that executes a variety of types of processing, such as a microcontroller unit (MCU) or an RFID tag.

The electronic component 700 can be used as electronic component (an IC chip) of electronic devices in a wide variety of fields, such as digital signal processing, software-defined radio systems, avionic systems (electronic devices used in aircraft, such as communication systems, navigation systems, autopilot systems, and flight management systems), ASIC prototyping, medical image processing, voice recognition, encryption, bioinformatics, emulators for mechanical systems, and radio telescopes in radio astronomy. Such an electric device can be used for display devices, personal computers (PCs), or image reproducing devices provided with recording media (typically, devices which reproduce the content of recording media such as digital versatile discs (DVDs) and have displays for displaying the reproduced images). Other examples of electronic appliances that can be equipped with the semiconductor device of one embodiment of the present invention are mobile phones, game machines including portable game machines, portable data appliances, e-book readers, cameras (e.g., video cameras and digital still cameras), wearable display devices (e.g., head mounted display devices, goggle-type display devices, glasses-type display devices, armband display devices, bracelet-type display devices, and necklace-type display devices), navigation systems, audio reproducing devices (e.g., car audio systems and digital audio players), copiers, facsimiles, printers, multifunction printers, automated teller machines (ATM), and vending machines. FIGS. 14A to 14F illustrate specific examples of these electronic devices.

Figure 14A:
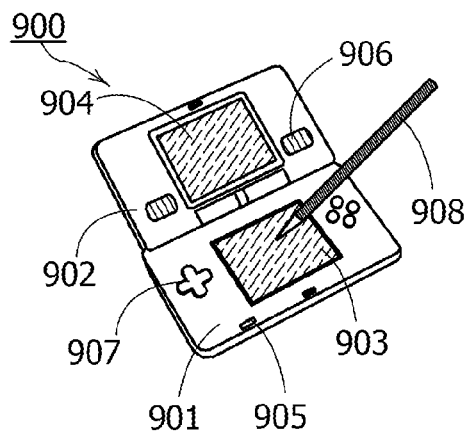
FIGS. 14A to 14F each illustrate a structure example of an electronic device.

A portable game machine 900 illustrated in FIG. 14A includes a housing 901, a housing 902, a display portion 903, a display portion 904, a microphone 905, a speaker 906, an operation key 907, a stylus 908, and the like.

Figure 14B:
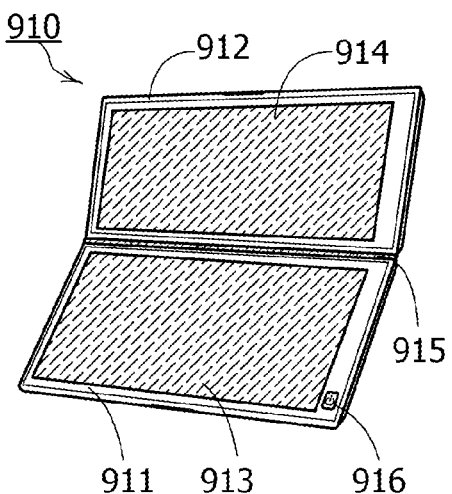

The portable information terminal 910 illustrated in FIG. 14B includes a housing 911, a housing 912, a display portion 913, a display portion 914, a joint 915, an operation key 916, and the like. The display portion 913 is provided in the housing 911, and the display portion 914 is provided in the housing 912. The housings 911 and 912 are connected to each other with the joint 915, and an angle between the housings 911 and 912 can be changed with the joint 915. An image on the display portion 913 may be switched depending on the angle between the housings 911 and 912 at the joint 915. A display device with a touch panel may be used as the display portion 913 and/or the display portion 914.

Figure 14C:
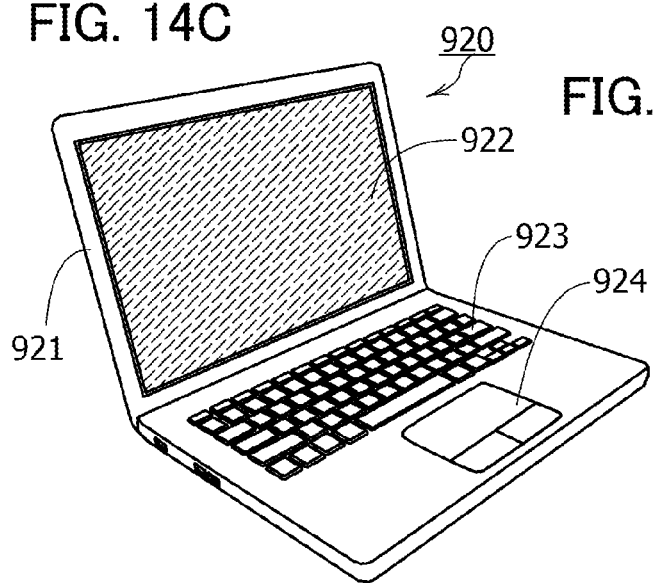

A notebook PC 920 illustrated in FIG. 14C includes a housing 921, a display portion 922, a keyboard 923, a pointing device 924, and the like.

Figure 14D:
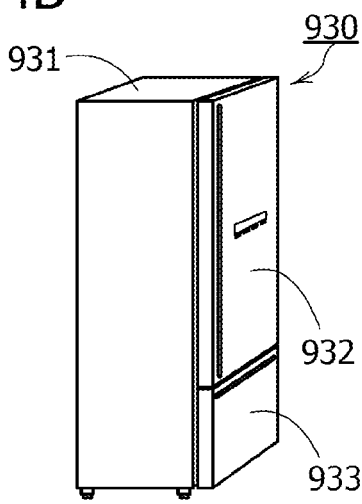

An electric refrigerator-freezer 930 illustrated in FIG. 14D includes a housing 931, a refrigerator door 932, a freezer door 933, and the like.

Figure 14E:
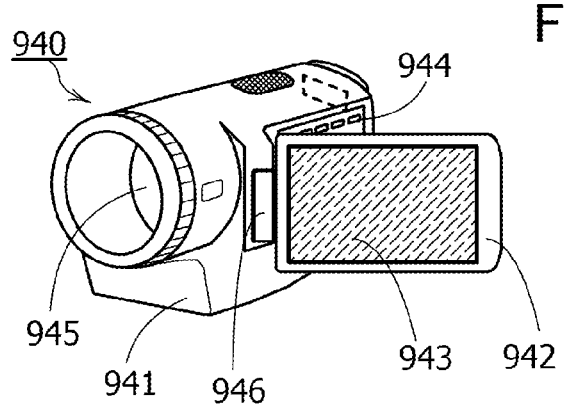

A video camera 940 illustrated in FIG. 14E includes a housing 941, a housing 942, a display portion 943, operation keys 944, a lens 945, a joint 946, and the like. The operation keys 944 and the lens 945 are provided in the housing 941, and the display portion 943 is provided in the housing 942. The housings 941 and 942 are connected to each other with the joint 946, and an angle between the housings 941 and 942 can be changed with the joint 946. The direction of an image on the display portion 943 may be changed and display and non-display of an image may be switched depending on the angle between the housings 941 and 942.

Figure 14F:
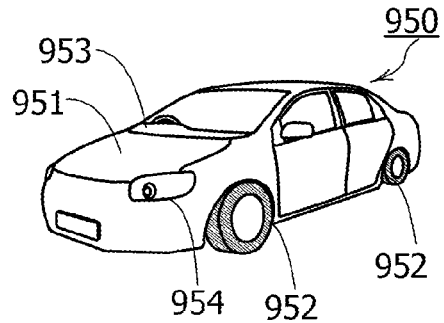

FIG. 14F is an external view illustrating a structure example of a motor vehicle. A motor vehicle 950 includes a car body 951, wheels 952, a dashboard 953, lights 954, and the like.

An electronic component including the semiconductor device described in the above embodiment is provided in each of the electronic devices described in this embodiment. Thus, an electronic device that consumes less power and has smaller size can be provided.

In this specification, for example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X Y, a source (or a first terminal or the like) of a transistor, and a drain (or a second terminal or the like) of the transistor are electrically connected to each other, and X the source (or the first terminal or the like) of the transistor, the drain (or the second terminal or the like) of the transistor, and Y are electrically connected to each other in this order", "a source (or a first terminal or the like) of a transistor is electrically connected to X a drain (or a second terminal or the like) of the transistor is electrically connected to Y, and X the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X the source (or the first terminal or the like) of the transistor, the drain (or the second terminal or the like) of the transistor, and Y are provided to be connected in this order". When the connection order in a circuit structure is defined by an expression similar to the above examples, a source (or a first terminal or the like) and a drain (or a second terminal or the like) of a transistor can be distinguished from each other to specify the technical scope. Note that one embodiment of the present invention is not limited to these expressions that are just examples. Here, X Y, Z1, and Z2 each denote an object (e.g., a device, an element, a circuit, a wiring, an electrode, a terminal, a conductive film, a layer, or the like).

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, one embodiment of the invention is clear even when connection portions are not specified. Furthermore, in the case where a connection portion is disclosed in this specification and the like, it can be determined that one embodiment of the invention in which a connection portion is not specified is disclosed in this specification and the like, in some cases. In particular, in the case where the number of portions to which the terminal is connected is plural, it is not necessary to specify the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least the connection portion of a circuit is specified. Alternatively, it might be possible for those skilled in the art to specify the invention when at least the function of a circuit is specified. In other words, one embodiment of the present invention is clear when the function of a circuit is specified. Furthermore, it can be determined that one embodiment of the present invention in which a function is specified is disclosed in this specification and the like in some cases. Thus, when the connection portion of a circuit is specified, the circuit is disclosed as one embodiment of the invention even if a function is not specified, and one embodiment of the invention can be constituted. Alternatively, when the function of a circuit is specified, the circuit is disclosed as one embodiment of the invention even when a connection portion is not specified, and one embodiment of the invention can be constituted.

EXPLANATION OF REFERENCE

100: semiconductor device, 101: semiconductor device, 111: semiconductor device, 112: semiconductor device, 113: semiconductor device, 114: semiconductor device, 10: circuit, 20: circuit, 30: circuit, and RC1: circuit.

This application is based on Japanese Patent Application serial no. 2014-081831 filed with Japan Patent Office on Apr. 11, 2014, the entire contents of which are hereby incorporated by reference.

The invention claimed is:

1. A holding circuit comprising:
   a first input terminal;
   a second input terminal;
   a third input terminal;
   a first output terminal;
   a first switch;
   a second switch;
   a third switch;
   a capacitor; and
   a node,
   wherein the first switch is configured to control conduction between the node and the first input terminal,
   wherein the second switch is configured to control conduction between the node and the first output terminal,
   wherein the third switch is configured to control conduction between the second input terminal and the first output terminal,
   wherein a first terminal of the capacitor is electrically connected to the node,
   wherein a second terminal of the capacitor is electrically connected to the third input terminal, and
   wherein the first switch and the second switch are each a transistor comprising an oxide semiconductor layer.

2. The holding circuit according to claim 1, wherein the third switch is a transistor comprising an oxide semiconductor layer.

3. The holding circuit according to claim 1, wherein the oxide semiconductor layer comprises indium, gallium, and zinc.

4. The holding circuit according to claim 1, wherein the oxide semiconductor layer has a crystal part with c-axis alignment.

5. A semiconductor device comprising:
   the holding circuit according to claim 1; and
   a circuit comprising:
   a fourth input terminal;
   a fifth input terminal;
   a second output terminal;
   a selection circuit; and
   a sequential circuit,
   wherein the selection circuit is configured to control conduction between an input terminal of the sequential circuit and one of the fourth input terminal and the fifth input terminal, wherein the second output terminal is electrically connected to an output terminal of the sequential circuit,
wherein the first output terminal of the holding circuit is electrically connected to the fifth input terminal, and
wherein the first input terminal of the holding circuit is electrically connected to the fourth input terminal, the second output terminal, or an internal node of the sequential circuit.

6. The semiconductor device according to claim 5, wherein one of the first input terminal and the first output terminal is electrically connected to one of a buffer circuit and an inverter circuit.

7. The semiconductor device according to claim 5, wherein the circuit comprises a transistor comprising silicon.

8. The semiconductor device according to claim 5 comprising:
a CPU core.

9. An electronic device comprising:
the semiconductor device according to claim 5; and
one of a housing, a microphone, a speaker, a display portion, and an operation key.

10. A method for driving a holding circuit comprising a first input terminal, a second input terminal, a third input terminal, an output terminal, a first switch, a second switch, a third switch, a capacitor, and a node, comprising a first processing comprising the steps of:
turning off the first switch and turning on the second switch and the third switch;
inputting a first potential to the second input terminal; and
inputting a second potential to the third input terminal,
wherein a first terminal of the first switch is electrically connected to the first input terminal,
wherein a second terminal of the first switch is electrically connected to the node,
wherein a first terminal of the second switch is electrically connected to the node,
wherein a second terminal of the second switch is electrically connected to the output terminal,
wherein a first terminal of the third switch is electrically connected to the second input terminal,
wherein a second terminal of the third switch is electrically connected to the output terminal,
wherein a first terminal of the capacitor is electrically connected to the node,
wherein a second terminal of the capacitor is electrically connected to the third input terminal, and
wherein the first switch and the second switch are each a transistor comprising an oxide semiconductor layer.

11. The method according to claim 10, wherein the third switch is a transistor comprising an oxide semiconductor layer.

12. The method according to claim 10, wherein the oxide semiconductor layer has a crystal part with c-axis alignment.

13. The method according to claim 10, wherein the oxide semiconductor layer comprises indium, gallium, and zinc.

14. The method according to claim 10, wherein the first potential is capable of making a logic level of the node low.

15. The method according to claim 10 comprising:
a second processing after the first processing; and
a third processing after the second processing,
wherein the second processing comprises the steps of:
turning on the first switch and turning off the second switch and the third switch; and
inputting a third potential that is higher than the second potential to the third input terminal, and
wherein the third processing comprises the steps of:
turning off the first switch, the second switch, and the third switch; and
inputting the third potential to the third input terminal.

16. The method according to claim 10 comprising:
a second processing after the first processing; and
a third processing after the second processing,
wherein the second processing comprises the steps of:
turning off the first switch and turning on the second switch and the third switch; and
inputting a third potential that is higher than the second potential to the third input terminal, and
wherein the third processing comprises the steps of:
turning off the first switch, the second switch, and the third switch; and
inputting the third potential to the third input terminal.

17. The method according to claim 16 comprising:
a fourth processing after the third processing,
wherein the fourth processing comprises the steps of:
turning off the first switch and the third switch;
turning on the second switch; and
inputting the third potential to the third input terminal.

18. A semiconductor device comprising:
a holding circuit comprising:
a first switch;
a second switch;
a third switch;
a capacitor; and
a node,
a circuit, an input terminal of the circuit being electrically connected to an output terminal of the holding circuit, comprising:
a sequential circuit; and
a selection circuit electrically connected between the input terminal of the circuit and the sequential circuit,
wherein a first terminal of the first switch is electrically connected to a first input terminal of the holding circuit,
wherein a second terminal of the first switch is electrically connected to the node,
wherein a first terminal of the second switch is electrically connected to the node,
wherein a second terminal of the second switch is electrically connected to the output terminal,
wherein a first terminal of the third switch is electrically connected to a second input terminal of the holding circuit,
wherein a second terminal of the third switch is electrically connected to the output terminal,
wherein a first terminal of the capacitor is electrically connected to the node,
wherein a second terminal of the capacitor is electrically connected to a third input terminal of the holding circuit, and
wherein the first switch and the second switch are each a transistor comprising an oxide semiconductor layer.

19. The semiconductor device according to claim 18, wherein the third switch is a transistor comprising an oxide semiconductor layer.

20. The semiconductor device according to claim 18, wherein the oxide semiconductor layer comprises indium, gallium, and zinc.

21. The semiconductor device according to claim 18, wherein the oxide semiconductor layer has a crystal part with c-axis alignment.

22. The semiconductor device according to claim 18, wherein the circuit comprises a transistor comprising silicon.

23. The semiconductor device according to claim 18, wherein the first input terminal of the holding circuit is electrically connected to the input terminal of the circuit, an output terminal of the circuit, or an internal node of the sequential circuit.

24. The semiconductor device according to claim 18, wherein one of the first input terminal and the output terminal is electrically connected to one of a buffer circuit and an inverter circuit.

25. The semiconductor device according to claim 18 comprising:
   a CPU core.

26. An electronic device comprising:
   the semiconductor device according to claim 18; and
   one of a housing, a microphone, a speaker, a display portion, and an operation key.

* * * * *

UNITED STATES PATENT AND TRADEMARK OFFICE
CERTIFICATE OF CORRECTION

PATENT NO.       : 9,601,215 B2
APPLICATION NO.  : 14/676923
DATED            : March 21, 2017
INVENTOR(S)      : Takuro Ohmaru Page 1 of 2

It is certified that error appears in the above-identified patent and that said Letters Patent is hereby corrected as shown below:

Column 2, Line 13, after "terminal" insert --.--;

Column 2, Line 20, after "terminal" insert --.--;

Column 4, Line 60, replace "Na," with --INa--;

Column 5, Line 16, replace "Na," with --INa--;

Column 7, Line 47, replace "Na" with --INa--;

Column 7, Line 53, replace "Na" with --INa--;

Column 8, Line 30, replace "Na" with --INa--;

Column 8, Line 60, replace "Na" with --INa--;

Column 9, Line 29, replace "0G3" with --OG3--;

Column 9, Line 54, replace "0G2" with --OG2--;

Column 10, Line 10, replace "0G3" with --OG3--;

Column 11, Line 7, after "determined" insert --.--;

Column 11, Line 40, replace "al" with --a1--;

Column 11, Line 57, replace "al" with --a1--;

Signed and Sealed this
Eighth Day of August, 2017

Joseph Matal
*Performing the Functions and Duties of the
Under Secretary of Commerce for Intellectual Property and
Director of the United States Patent and Trademark Office*

CERTIFICATE OF CORRECTION (continued)
U.S. Pat. No. 9,601,215 B2

Column 11, Line 64, replace "al" with --a1--;

Column 11, Line 66, replace "al" with --a1--;

Column 12, Line 29, replace "Na" with --INa--;

Column 17, Line 13, after "5" and before "$10^{18}$" insert --×--;

Column 19, Line 9, replace "28" with --20--;

Column 31, Line 12, after "X" insert --,--;

Column 31, Line 15, after "X" insert --,--;

Column 31, Line 20, after "X" insert --,--;

Column 31, Line 21, after "X" insert --,--;

Column 31, Line 27, after "X" insert --,--; and

Column 31, Line 36, after "X" insert --,--.